(12) United States Patent
Chang et al.

(10) Patent No.: US 8,980,484 B2
(45) Date of Patent: Mar. 17, 2015

(54) MONITORING ELECTROLYTE CONCENTRATIONS IN REDOX FLOW BATTERY SYSTEMS

(75) Inventors: On Kok Chang, San Jose, CA (US); David Andrew Sopchak, Oakland, CA (US); Ai Quoc Pham, Milpitas, CA (US); Kimio Kinoshita, Cupertino, CA (US)

(73) Assignee: Enervault Corporation, Sunnyvale, CA (US)

( * ) Notice: Subject to any disclaimer, the term of this patent is extended or adjusted under 35 U.S.C. 154(b) by 182 days.

(21) Appl. No.: 13/432,243

(22) Filed: Mar. 28, 2012

(65) Prior Publication Data
US 2013/0084506 A1    Apr. 4, 2013

Related U.S. Application Data

(60) Provisional application No. 61/468,733, filed on Mar. 29, 2011.

(51) Int. Cl.
| H01M 8/00 | (2006.01) |
| G01R 31/36 | (2006.01) |
| H01M 8/18 | (2006.01) |

(52) U.S. Cl.
CPC ........... *G01R 31/3606* (2013.01); *H01M 8/188* (2013.01); *Y02E 60/528* (2013.01)
USPC ...................................................... 429/400

(58) Field of Classification Search
None
See application file for complete search history.

(56) References Cited

U.S. PATENT DOCUMENTS

| 2,946,836 | A | 7/1960 | Justi et al. | |
| 3,540,934 | A | 11/1970 | Boeke | 136/86 |
| 3,934,624 | A | 1/1976 | Eberle | 141/100 |
| 3,996,064 | A | 12/1976 | Thaller | 320/2 |
| 3,999,581 | A | 12/1976 | Eberle | 141/1 |
| 4,010,780 | A | 3/1977 | Eberle | 141/168 |
| 4,018,971 | A | 4/1977 | Sheibley et al. | 429/105 |
| 4,062,807 | A | 12/1977 | Suzuki | 252/443 |
| 4,071,660 | A | 1/1978 | Hart | 429/15 |
| 4,117,204 | A | 9/1978 | Zito, Jr. | 429/19 |

(Continued)

FOREIGN PATENT DOCUMENTS

| CN | 101213700 A | 7/2008 |
| JP | 57-9072 A | 1/1982 |

(Continued)

OTHER PUBLICATIONS

WO 2008/148148 A1 (Skyllas-Kazacos) in view Shah et al. (Electrochimica Acta 53 (2008) 8087-8100).*

(Continued)

*Primary Examiner* — Patrick Ryan
*Assistant Examiner* — Jose Colucci Rios
(74) *Attorney, Agent, or Firm* — The Marbury Law Group, PLLC

(57) ABSTRACT

Methods, systems and structures for monitoring, managing electrolyte concentrations in redox flow batteries are provided by introducing a first quantity of a liquid electrolyte into a first chamber of a test cell and introducing a second quantity of the liquid electrolyte into a second chamber of the test cell. The method further provides for measuring a voltage of the test cell, measuring an elapsed time from the test cell reaching a first voltage until the test cell reaches a second voltage; and determining a degree of imbalance of the liquid electrolyte based on the elapsed time.

30 Claims, 16 Drawing Sheets

(56) References Cited

U.S. PATENT DOCUMENTS

| | | | | |
|---|---|---|---|---|
| 4,133,941 | A | 1/1979 | Sheibley | 429/33 |
| 4,147,843 | A | 4/1979 | Hakkinen | 429/109 |
| 4,159,366 | A | 6/1979 | Thaller | 429/15 |
| 4,162,351 | A | 7/1979 | Putt et al. | 429/15 |
| 4,192,910 | A | 3/1980 | Giner et al. | 429/101 |
| 4,200,684 | A | 4/1980 | Bro | 429/51 |
| 4,264,686 | A | 4/1981 | Frank | 429/44 |
| 4,270,984 | A | 6/1981 | Frosch et al. | 204/2.1 |
| 4,307,159 | A | 12/1981 | Hammond et al. | 429/105 |
| 4,309,372 | A | 1/1982 | Sheibley | 264/45.3 |
| 4,362,791 | A | 12/1982 | Kaneko et al. | 429/101 |
| 4,370,392 | A | 1/1983 | Savinell et al. | 429/15 |
| 4,377,623 | A | 3/1983 | Parker et al. | 429/15 |
| 4,382,116 | A | 5/1983 | Gahn et al. | 429/34 |
| 4,399,200 | A | 8/1983 | Galloway | 429/23 |
| 4,407,902 | A | 10/1983 | Kummer et al. | 429/15 |
| 4,414,090 | A | 11/1983 | D'Agostino et al. | 204/252 |
| 4,454,649 | A | 6/1984 | Jalan et al. | 29/623.5 |
| 4,468,441 | A | 8/1984 | D'Agostino et al. | 429/105 |
| 4,469,760 | A | 9/1984 | Giner et al. | 429/21 |
| 4,485,154 | A | 11/1984 | Remick et al. | 429/14 |
| 4,492,741 | A | 1/1985 | Struthers | 429/34 |
| 4,496,637 | A | 1/1985 | Shimada et al. | 429/44 |
| 4,543,302 | A | 9/1985 | Gahn et al. | 429/15 |
| 4,576,878 | A | 3/1986 | Gahn | 429/15 |
| 4,578,323 | A | 3/1986 | Hertl et al. | 429/15 |
| 4,615,108 | A | 10/1986 | Tomazic | 29/623.2 |
| 4,650,732 | A | 3/1987 | Weber | 429/120 |
| 4,652,501 | A | 3/1987 | Bennetto et al. | 429/2 |
| 4,711,828 | A | 12/1987 | Ishida et al. | 429/12 |
| 4,714,663 | A | 12/1987 | Arnold, Jr. et al. | 429/101 |
| 4,784,924 | A | 11/1988 | Savinell et al. | 429/15 |
| 4,786,567 | A | 11/1988 | Skyllas-Kazacos et al. | 429/19 |
| 4,797,566 | A | 1/1989 | Nozaki et al. | 307/43 |
| 4,814,241 | A | 3/1989 | Nagashima et al. | 429/199 |
| 4,874,483 | A | 10/1989 | Wakabayashi et al. | 204/94 |
| 4,882,241 | A | 11/1989 | Heinzel | 429/19 |
| 4,945,019 | A | 7/1990 | Bowen et al. | 429/72 |
| 4,956,244 | A | 9/1990 | Shimizu et al. | 429/17 |
| 5,061,578 | A | 10/1991 | Kozuma et al. | 429/3 |
| 5,135,820 | A | 8/1992 | Jones | 429/49 |
| 5,162,168 | A | 11/1992 | Downing et al. | 429/51 |
| 5,188,911 | A | 2/1993 | Downing et al. | 429/70 |
| 5,250,158 | A | 10/1993 | Kaneko et al. | 204/86 |
| 5,258,241 | A | 11/1993 | Ledjeff et al. | 429/42 |
| 5,308,718 | A | 5/1994 | Eidler et al. | 429/152 |
| 5,316,643 | A | 5/1994 | Ahn et al. | 204/265 |
| 5,318,865 | A | 6/1994 | Kaneko et al. | 429/193 |
| 5,366,824 | A | 11/1994 | Nozaki et al. | 429/34 |
| 5,368,762 | A | 11/1994 | Sato et al. | 252/62.2 |
| 5,391,973 | A | 2/1995 | Tomazic | 320/21 |
| 5,436,087 | A | 7/1995 | Tomazic | 429/50 |
| 5,445,905 | A | 8/1995 | Marsh et al. | 429/105 |
| 5,459,390 | A | 10/1995 | Tomazic | 320/30 |
| 5,587,132 | A | 12/1996 | Nakajima et al. | 423/62 |
| 5,601,943 | A | 2/1997 | Eidler et al. | 429/163 |
| 5,605,771 | A | 2/1997 | Eidler et al. | 429/72 |
| 5,607,788 | A | 3/1997 | Tomazic | 429/72 |
| 5,610,802 | A | 3/1997 | Eidler et al. | 361/831 |
| 5,612,148 | A | 3/1997 | Zito | 429/15 |
| 5,626,986 | A | 5/1997 | Jahns et al. | 429/210 |
| 5,650,239 | A | 7/1997 | Lex et al. | 429/49 |
| 5,656,390 | A | 8/1997 | Kageyama et al. | 429/44 |
| 5,665,212 | A | 9/1997 | Zhong et al. | 304/297 R |
| 5,702,842 | A | 12/1997 | Tomazic | 429/105 |
| 5,716,733 | A | 2/1998 | Tomazic | 429/130 |
| 5,759,711 | A | 6/1998 | Miyabayashi et al. | 429/15 |
| 5,798,180 | A | 8/1998 | Chowdhury et al. | 428/411.1 |
| 5,804,329 | A | 9/1998 | Amendola | 429/34 |
| 5,851,694 | A | 12/1998 | Miyabayashi et al. | 429/105 |
| 5,910,366 | A | 6/1999 | Chowdhury et al. | 428/379 |
| 6,005,183 | A | 12/1999 | Akai et al. | 136/244 |
| 6,040,075 | A | 3/2000 | Adcock et al. | 429/32 |
| 6,086,643 | A | 7/2000 | Clark et al. | 29/623.2 |
| 6,096,179 | A | 8/2000 | Fajt et al. | 204/294 |
| 6,143,443 | A | 11/2000 | Kazacos et al. | 429/204 |
| 6,242,125 | B1 | 6/2001 | Eidler et al. | 429/51 |
| 6,261,714 | B1 | 7/2001 | Eidler et al. | 429/70 |
| 6,455,187 | B1 | 9/2002 | Tomazic | 429/72 |
| 6,461,772 | B1 | 10/2002 | Miyake et al. | 429/247 |
| 6,468,688 | B2 | 10/2002 | Kazacos et al. | 429/101 |
| 6,475,661 | B1 | 11/2002 | Pellegri et al. | 429/105 |
| 6,497,973 | B1 | 12/2002 | Amendola | 429/19 |
| 6,509,119 | B1 | 1/2003 | Kobayashi et al. | 429/231.8 |
| 6,555,267 | B1 | 4/2003 | Broman et al. | 429/210 |
| 6,558,833 | B2 | 5/2003 | McCoy | 429/70 |
| 6,562,514 | B1 | 5/2003 | Kazacos et al. | 429/204 |
| 6,613,298 | B2 | 9/2003 | Tanaka et al. | 423/62 |
| 6,624,383 | B1 | 9/2003 | Lichtenstein et al. | 219/121.69 |
| 6,652,819 | B2 | 11/2003 | Shiroto et al. | 423/62 |
| 6,692,862 | B1 | 2/2004 | Zocchi | 429/50 |
| 6,711,036 | B2 | 3/2004 | Winter | 363/65 |
| 6,759,158 | B2 | 7/2004 | Tomazic | 429/61 |
| 6,761,945 | B1 | 7/2004 | Adachi et al. | 428/36.1 |
| 6,764,663 | B2 | 7/2004 | Monaghan et al. | 423/62 |
| 6,764,789 | B1 | 7/2004 | Sekiguchi et al. | 429/105 |
| 6,812,171 | B2 | 11/2004 | Shimazaki et al. | 442/337 |
| 6,864,012 | B2 | 3/2005 | Tomazic | 429/72 |
| 6,872,376 | B2 | 3/2005 | Tanaka et al. | 423/544 |
| 6,905,797 | B2 | 6/2005 | Broman et al. | 429/235 |
| 6,986,966 | B2 | 1/2006 | Clarke et al. | 429/210 |
| 7,046,531 | B2 | 5/2006 | Zocchi et al. | 363/65 |
| 7,060,738 | B2 | 6/2006 | Jing et al. | 522/187 |
| 7,060,756 | B2 | 6/2006 | Jing et al. | 525/327.4 |
| 7,061,205 | B2 | 6/2006 | Shigematsu et al. | 320/101 |
| 7,071,271 | B2 | 7/2006 | Thaler et al. | 526/243 |
| 7,078,123 | B2 | 7/2006 | Kazacos et al. | 429/105 |
| 7,112,614 | B2 | 9/2006 | Jing et al. | 521/27 |
| 7,173,067 | B2 | 2/2007 | Guerra | 521/31 |
| 7,181,183 | B1 | 2/2007 | Hennessy | 455/289 |
| 7,184,903 | B1 | 2/2007 | Williams et al. | 702/60 |
| 7,199,550 | B2 | 4/2007 | Tsutsui et al. | 320/101 |
| 7,220,515 | B2 | 5/2007 | Ito et al. | 429/72 |
| 7,227,275 | B2 | 6/2007 | Hannessy et al. | 290/55 |
| 7,258,947 | B2 | 8/2007 | Kubata et al. | 429/122 |
| 7,259,208 | B2 | 8/2007 | Guerra et al. | 525/178 |
| 7,265,162 | B2 | 9/2007 | Yandrasits et al. | 522/156 |
| 7,265,456 | B2 | 9/2007 | Hennessy | 290/44 |
| 7,270,911 | B2 | 9/2007 | Clarke et al. | 429/105 |
| 7,297,437 | B2 | 11/2007 | Clarke et al. | 429/105 |
| 7,309,540 | B2 | 12/2007 | Wang | 429/33 |
| 7,314,761 | B2 | 1/2008 | Winter | 436/151 |
| 7,320,844 | B2 | 1/2008 | Skyllas-Kazacos | 429/105 |
| 7,326,737 | B2 | 2/2008 | Guerra | 521/31 |
| 7,332,065 | B2 | 2/2008 | Shimamune | 204/290.13 |
| 7,353,083 | B2 | 4/2008 | Hennessy | 700/286 |
| 7,389,189 | B2 | 6/2008 | Williams et al. | 702/60 |
| 7,411,022 | B2 | 8/2008 | Guerra et al. | 525/178 |
| 7,517,608 | B2 | 4/2009 | Brereton et al. | 429/71 |
| 7,537,859 | B2 | 5/2009 | Samuel et al. | 429/101 |
| 7,554,220 | B2 | 6/2009 | Sugawara | 307/64 |
| 7,557,531 | B2 | 7/2009 | Willets et al. | 320/101 |
| 7,670,719 | B2 | 3/2010 | Nakaishi et al. | 429/163 |
| 7,682,728 | B2 | 3/2010 | Harper | 429/101 |
| 7,687,193 | B2 | 3/2010 | Harper | 429/101 |
| 7,704,634 | B2 | 4/2010 | Deguchi et al. | 429/105 |
| 7,740,977 | B2 | 6/2010 | Lepp et al. | 429/72 |
| 7,820,321 | B2 | 10/2010 | Horne et al. | 429/149 |
| 7,855,005 | B2 | 12/2010 | Sahu | 429/51 |
| 7,919,204 | B2 | 4/2011 | Sahu | 429/105 |
| 7,923,965 | B2 | 4/2011 | Ritter et al. | 320/127 |
| 7,927,731 | B2 | 4/2011 | Sahu | 429/101 |
| 7,939,190 | B2 | 5/2011 | Colello et al. | 429/61 |
| 7,976,974 | B2 | 7/2011 | Kazacos et al. | 429/105 |
| 7,993,932 | B2 | 8/2011 | Winter | 436/151 |
| 8,008,808 | B2 | 8/2011 | Seeker et al. | 307/72 |
| 8,029,944 | B2 | 10/2011 | Yau et al. | 429/523 |
| 8,039,161 | B2 | 10/2011 | Winter | 429/447 |
| 8,048,555 | B2 | 11/2011 | Darcy et al. | 429/122 |
| 8,137,830 | B2 | 3/2012 | Whitacre | 429/50 |
| 8,137,831 | B1 | 3/2012 | La O' et al. | 429/51 |
| 8,168,337 | B2 | 5/2012 | Friesen et al. | 429/402 |
| 8,182,940 | B2 | 5/2012 | Ridley | 429/210 |
| 8,202,641 | B2 | 6/2012 | Winter et al. | 429/80 |

(56) References Cited

U.S. PATENT DOCUMENTS

| | | | |
|---|---|---|---|
| 8,221,911 B2 | 7/2012 | Kumamoto et al. ............ 429/51 |
| 8,222,043 B2 | 7/2012 | Winter .......................... 436/151 |
| 8,551,299 B2 | 10/2013 | Keshavarz et al. |
| 8,877,365 B2 | 11/2014 | Keshavarz et al. |
| 2001/0055713 A1 | 12/2001 | Eidler et al. .................... 429/81 |
| 2003/0007370 A1 | 1/2003 | Winter ............................ 363/37 |
| 2003/0008204 A1 | 1/2003 | Winter et al. ................... 429/81 |
| 2003/0113615 A1 | 6/2003 | Tomazic ......................... 429/70 |
| 2003/0143456 A1 | 7/2003 | Kazacos et al. ................ 429/31 |
| 2003/0165741 A1 | 9/2003 | Maly-Schreiber et al. ... 429/235 |
| 2004/0070370 A1 | 4/2004 | Emura ........................... 320/128 |
| 2004/0121204 A1 | 6/2004 | Adelman et al. |
| 2004/0170893 A1 | 9/2004 | Nakaishi et al. .............. 429/185 |
| 2004/0202915 A1 | 10/2004 | Nakaishi et al. ................ 429/34 |
| 2004/0241544 A1 | 12/2004 | Nakaishi et al. .............. 429/210 |
| 2004/0241552 A1 | 12/2004 | Skyllas-Kazacos .......... 429/304 |
| 2005/0074653 A1 | 4/2005 | Broman et al. ................. 429/33 |
| 2005/0074665 A1 | 4/2005 | Spaziante et al. .............. 429/50 |
| 2005/0118494 A1 | 6/2005 | Choi |
| 2005/0158614 A1 | 7/2005 | Hennessy ....................... 429/61 |
| 2005/0158615 A1 | 7/2005 | Samuel et al. .................. 429/81 |
| 2005/0164075 A1 | 7/2005 | Kumamoto et al. ............ 429/50 |
| 2005/0244707 A1 | 11/2005 | Skyllas-Kazacos et al. .. 429/105 |
| 2005/0287436 A1 | 12/2005 | Kawashige et al. .......... 429/189 |
| 2006/0063065 A1 | 3/2006 | Clarke et al. ................. 429/105 |
| 2006/0183016 A1 | 8/2006 | Kazacos et al. .............. 429/105 |
| 2007/0021300 A1 | 1/2007 | Farant ........................... 502/100 |
| 2007/0035135 A1 | 2/2007 | Yoshida ......................... 290/44 |
| 2007/0072067 A1 | 3/2007 | Symons et al. ............... 429/101 |
| 2007/0246352 A1 | 10/2007 | Keister ...................... 204/278.5 |
| 2008/0193828 A1 | 8/2008 | Sahu |
| 2008/0292964 A1 | 11/2008 | Kazacos et al. ............ 429/231.5 |
| 2008/0299439 A1 | 12/2008 | Wang ............................. 429/34 |
| 2009/0017379 A1 | 1/2009 | Inatomi et al. ................ 429/213 |
| 2009/0110998 A1 | 4/2009 | Miyachi et al. ................. 429/33 |
| 2009/0130525 A1 | 5/2009 | Miyachi et al. ................. 429/33 |
| 2009/0197151 A1 | 8/2009 | Kumamoto et al. ............ 429/51 |
| 2009/0208807 A1 | 8/2009 | Miyachi et al. ................. 429/33 |
| 2009/0212262 A1 | 8/2009 | Elson et al. ................... 252/500 |
| 2009/0225573 A1 | 9/2009 | Sugawara .................. 363/56.01 |
| 2009/0253025 A1 | 10/2009 | Whitacre ........................ 429/50 |
| 2009/0295162 A1 | 12/2009 | Oohara et al. .................. 290/44 |
| 2010/0003545 A1 | 1/2010 | Horne et al. .................... 429/12 |
| 2010/0047671 A1 | 2/2010 | Chiang et al. .................. 429/50 |
| 2010/0086639 A1 | 4/2010 | Ridley ............................ 429/36 |
| 2010/0089480 A1 | 4/2010 | Sahu et al. ..................... 138/121 |
| 2010/0090651 A1 | 4/2010 | Sahu et al. ..................... 320/132 |
| 2010/0092757 A1 | 4/2010 | Nair et al. ................... 428/306.6 |
| 2010/0092807 A1 | 4/2010 | Sahu et al. ....................... 429/10 |
| 2010/0092843 A1 | 4/2010 | Conway ........................... 429/51 |
| 2010/0094468 A1 | 4/2010 | Sahu et al. ..................... 700/281 |
| 2010/0112391 A1 | 5/2010 | Salloum et al. ................. 429/14 |
| 2010/0119895 A1 | 5/2010 | Friesen ............................ 429/17 |
| 2010/0119937 A1 | 5/2010 | Winter .......................... 429/185 |
| 2010/0136455 A1 | 6/2010 | Winter .......................... 429/458 |
| 2010/0143781 A1 | 6/2010 | Keshavarz et al. ........... 429/107 |
| 2010/0178533 A1 | 7/2010 | Whitehead et al. .............. 429/7 |
| 2010/0188045 A1 | 7/2010 | Colello et al. ................ 320/118 |
| 2010/0216006 A1 | 8/2010 | Rennebeck .................... 429/105 |
| 2010/0243459 A1 | 9/2010 | Friesen et al. ................. 205/50 |
| 2010/0261070 A1 | 10/2010 | Keshavarz et al. ........... 429/345 |
| 2010/0285375 A1 | 11/2010 | Friesen et al. ................ 429/405 |
| 2010/0316935 A1 | 12/2010 | Friesen et al. ................ 429/512 |
| 2010/0323264 A1 | 12/2010 | Chiang et al. ................. 429/449 |
| 2010/0330437 A1 | 12/2010 | Burchardt et al. ............ 429/406 |
| 2011/0014527 A1 | 1/2011 | Ohlsen .......................... 429/408 |
| 2011/0045332 A1 | 2/2011 | Horne et al. .................. 429/105 |
| 2011/0052945 A1 | 3/2011 | Whitacre ........................ 429/50 |
| 2011/0070483 A1 | 3/2011 | Keshavarz et al. ........... 429/188 |
| 2011/0070506 A1 | 3/2011 | Friesen et al. ................ 429/404 |
| 2011/0074357 A1 | 3/2011 | Parakulam et al. ........... 320/134 |
| 2011/0076526 A1 | 3/2011 | Zu et al. .......................... 429/51 |
| 2011/0079074 A1 | 4/2011 | Sahu .......................... 73/25.03 |
| 2011/0080143 A1 | 4/2011 | Parakulam et al. ........... 320/162 |
| 2011/0081561 A1 | 4/2011 | Keshavarz et al. ............. 429/49 |
| 2011/0081562 A1 | 4/2011 | Parakulam et al. ............. 429/50 |
| 2011/0086247 A1 | 4/2011 | Keshavarz et al. ............... 429/9 |
| 2011/0086278 A1 | 4/2011 | Friesen et al. ................ 429/402 |
| 2011/0117411 A1 | 5/2011 | Horne et al. .................. 429/120 |
| 2011/0189520 A1 | 8/2011 | Carter et al. .................. 429/107 |
| 2011/0189549 A1 | 8/2011 | Sun et al. ...................... 429/338 |
| 2011/0189551 A1 | 8/2011 | Friesen et al. ................ 429/405 |
| 2011/0195283 A1 | 8/2011 | Sun et al. ........................ 429/80 |
| 2011/0200853 A1 | 8/2011 | Winter ............................ 429/51 |
| 2011/0200890 A1 | 8/2011 | Kocherginsky ............... 429/402 |
| 2011/0200893 A1 | 8/2011 | Friesen et al. ................ 429/404 |
| 2011/0204637 A1 | 8/2011 | Ritter et al. ..................... 290/44 |
| 2011/0206960 A1 | 8/2011 | Winter ............................ 429/70 |
| 2011/0223450 A1 | 9/2011 | Horne et al. .................... 429/72 |
| 2011/0223451 A1 | 9/2011 | Winter et al. ................... 429/80 |
| 2011/0244277 A1 | 10/2011 | Gordon, II et al. ............. 429/51 |
| 2011/0250512 A1 | 10/2011 | Friesen et al. ................ 429/405 |
| 2011/0256435 A1 | 10/2011 | Kim et al. ....................... 429/94 |
| 2011/0269055 A1 | 11/2011 | Perry ............................ 429/480 |
| 2011/0273022 A1 | 11/2011 | Dennis et al. ................... 307/72 |
| 2011/0273129 A1 | 11/2011 | Coe et al. ...................... 320/101 |
| 2011/0274950 A1 | 11/2011 | Whitacre ........................ 429/50 |
| 2011/0281169 A1 | 11/2011 | Zheng et al. ................ 429/231.8 |
| 2011/0281184 A1 | 11/2011 | Friesen et al. ................ 429/405 |
| 2011/0282807 A1 | 11/2011 | Colello et al. ................ 705/412 |
| 2011/0300417 A1 | 12/2011 | Mou et al. ....................... 429/50 |
| 2011/0305959 A1 | 12/2011 | Friesen et al. ................ 429/405 |
| 2011/0311846 A1 | 12/2011 | Whitacre ........................ 429/50 |
| 2011/0311896 A1 | 12/2011 | Harper et al. ................. 429/447 |
| 2011/0315934 A1 | 12/2011 | Ma et al. ....................... 252/511 |
| 2011/0316485 A1 | 12/2011 | Krishnan et al. ............. 320/137 |
| 2011/0318619 A1 | 12/2011 | Winter ............................ 429/72 |
| 2011/0318644 A1 | 12/2011 | Zhai et al. ..................... 429/249 |
| 2012/0009491 A1 | 1/2012 | Friesen et al. ................ 429/418 |
| 2012/0015264 A1 | 1/2012 | Friesen et al. ................ 429/415 |
| 2012/0021303 A1 | 1/2012 | Amendola et al. ............ 429/406 |
| 2012/0040254 A1 | 2/2012 | Amendola et al. ............ 429/406 |
| 2012/0045669 A1 | 2/2012 | Darcy et al. .................... 429/51 |
| 2012/0045680 A1 | 2/2012 | Dong et al. ................... 429/109 |
| 2012/0052347 A1 | 3/2012 | Wilson et al. ................... 429/72 |
| 2012/0052404 A1 | 3/2012 | Friesen et al. ................ 429/409 |
| 2012/0058370 A1 | 3/2012 | Kell et al. ....................... 429/51 |
| 2012/0064388 A1 | 3/2012 | Whitacre et al. ............. 429/160 |
| 2012/0068667 A1 | 3/2012 | Friesen et al. ................ 320/135 |
| 2012/0077067 A1 | 3/2012 | Li et al. ........................ 429/107 |
| 2012/0077068 A1 | 3/2012 | Wang et al. .................. 429/107 |
| 2012/0077079 A1 | 3/2012 | Li et al. ........................ 429/199 |
| 2012/0077095 A1 | 3/2012 | Roumi et al. ................. 429/405 |
| 2012/0107660 A1 | 5/2012 | Li et al. ........................ 429/105 |
| 2012/0107661 A1 | 5/2012 | Lee et al. ...................... 429/107 |
| 2012/0115069 A1 | 5/2012 | Noack et al. ................. 429/498 |
| 2012/0129021 A1 | 5/2012 | Winter ............................ 429/67 |
| 2012/0135278 A1 | 5/2012 | Yoshie et al. ..................... 429/7 |
| 2012/0139496 A1 | 6/2012 | Krishnan et al. ............. 320/134 |
| 2012/0156535 A1 | 6/2012 | Harrer et al. ................... 429/82 |
| 2012/0164498 A1 | 6/2012 | Vincent et al. ................. 429/80 |
| 2012/0168975 A1 | 7/2012 | Perry et al. .................. 264/29.6 |
| 2012/0171530 A1 | 7/2012 | Lee et al. ........................ 429/70 |
| 2012/0171531 A1 | 7/2012 | Park et al. ....................... 429/70 |
| 2012/0171541 A1 | 7/2012 | Park et al. ..................... 429/107 |
| 2012/0183816 A1 | 7/2012 | Keshavarz et al. ............. 429/51 |
| 2012/0183872 A1 | 7/2012 | Keshavarz et al. ........... 429/429 |
| 2012/0185187 A1 | 7/2012 | Parakulam et al. ........... 702/63 |
| 2012/0185572 A1 | 7/2012 | Parakulam et al. ........... 709/219 |
| 2012/0208061 A1 | 8/2012 | Sahu et al. |

FOREIGN PATENT DOCUMENTS

| | | |
|---|---|---|
| JP | 59-205165 A | 11/1984 |
| JP | 60-070672 U | 4/1985 |
| JP | 60-115174 A | 6/1985 |
| JP | 60-148068 A | 8/1985 |
| JP | 61-173468 A | 8/1986 |
| JP | 61-269866 A | 11/1986 |
| JP | 62-52861 A | 3/1987 |
| JP | 62-108465 A | 5/1987 |
| JP | 62-119874 A | 6/1987 |
| JP | 63-24565 A | 2/1988 |
| JP | 63-76268 A | 4/1988 |

(56) References Cited

FOREIGN PATENT DOCUMENTS

| | | |
|---|---|---|
| JP | 63-148563 A | 6/1988 |
| JP | 63-150867 U | 6/1988 |
| JP | 63150861 U | 6/1988 |
| JP | 63150867 | 6/1988 |
| JP | 63205057 | 8/1988 |
| JP | 64-12466 A | 1/1989 |
| JP | 64-82465 A | 3/1989 |
| JP | 1-176227 A | 7/1989 |
| JP | 1-176228 A | 7/1989 |
| JP | 6-79491 B2 | 10/1994 |
| JP | 6-325784 A | 11/1994 |
| JP | 8-78042 A | 3/1996 |
| JP | 09-101286 A | 4/1997 |
| JP | 10-162852 A | 6/1998 |
| JP | 3242205 B2 | 12/2001 |
| JP | 2002-329523 A | 11/2002 |
| JP | 2003142141 | 5/2003 |
| JP | 2003-173812 A | 6/2003 |
| JP | 2003173812 A | 6/2003 |
| JP | 2003317788 A | 11/2003 |
| JP | 2004-335158 A | 11/2004 |
| JP | 3642697 B2 | 4/2005 |
| JP | 2005-142056 A | 6/2005 |
| JP | 2005-209525 A | 8/2005 |
| JP | 2005-228617 A | 8/2005 |
| JP | 2005-228622 A | 8/2005 |
| JP | 2005-228633 A | 8/2005 |
| JP | 2005-228645 A | 8/2005 |
| JP | 2005-243326 A | 9/2005 |
| JP | 2005-322447 A | 11/2005 |
| JP | 2005-322448 A | 11/2005 |
| JP | 2005-340029 A | 12/2005 |
| JP | 2005-340030 A | 12/2005 |
| JP | 2005-347106 A | 12/2005 |
| JP | 2005-347107 A | 12/2005 |
| JP | 3729296 B2 | 12/2005 |
| JP | 2006-12425 A | 1/2006 |
| JP | 3738227 B2 | 1/2006 |
| JP | 2006-40591 A | 2/2006 |
| JP | 2006-40648 A | 2/2006 |
| JP | 2006-73471 A | 3/2006 |
| JP | 2006-93016 A | 4/2006 |
| JP | 2006-107888 A | 4/2006 |
| JP | 2006-107988 A | 4/2006 |
| JP | 2006-114359 A | 4/2006 |
| JP | 2006-114360 A | 4/2006 |
| JP | 2006-147306 A | 6/2006 |
| JP | 2006-147374 A | 6/2006 |
| JP | 2006-147375 A | 6/2006 |
| JP | 2006-147376 A | 6/2006 |
| JP | 2006-156029 A | 6/2006 |
| JP | 3797578 B2 | 7/2006 |
| JP | 2006-253023 A | 9/2006 |
| JP | 2006-254682 A | 9/2006 |
| JP | 2006-302643 A | 11/2006 |
| JP | 2006-351346 A | 12/2006 |
| JP | 2006351346 A | 12/2006 |
| JP | 2009-16216 A | 1/2009 |
| JP | 2009-16217 A | 1/2009 |
| JP | 2009-16218 A | 1/2009 |
| JP | 2009-16219 A | 1/2009 |
| JP | 2009076217 A | 1/2009 |
| JP | 2010-86935 A | 4/2010 |
| JP | 2010-170782 A | 8/2010 |
| JP | 2010-244972 A | 10/2010 |
| JP | 2010-277810 A | 12/2010 |
| JP | 2010-277811 A | 12/2010 |
| JP | 2011-119283 A | 6/2011 |
| WO | 90/03666 A1 | 4/1990 |
| WO | 99/39397 A1 | 8/1999 |
| WO | 2004079849 A1 | 9/2004 |
| WO | 2005/001981 A2 | 1/2005 |
| WO | 2005/014484 A1 | 2/2005 |
| WO | 2006135958 A1 | 12/2006 |
| WO | 2007/101284 A1 | 9/2007 |
| WO | 2007/130659 A2 | 11/2007 |
| WO | 2008/148148 A1 | 12/2008 |
| WO | 2009/106452 A1 | 9/2009 |
| WO | 2009/156259 A1 | 12/2009 |
| WO | 2010/094657 A1 | 8/2010 |
| WO | 2010/118060 A1 | 10/2010 |
| WO | 2010/142080 A1 | 12/2010 |
| WO | 2010/143634 A1 | 12/2010 |
| WO | 2011/022390 A2 | 2/2011 |
| WO | 2011/044778 A1 | 4/2011 |
| WO | 2011/075135 A1 | 6/2011 |
| WO | 2011/080334 A2 | 7/2011 |
| WO | 2011/088761 A1 | 7/2011 |
| WO | 2011/111254 A1 | 9/2011 |
| WO | 2011/111717 A1 | 9/2011 |
| WO | 2011/123102 A1 | 10/2011 |
| WO | 2011/129215 A1 | 10/2011 |
| WO | 2011/136256 A1 | 11/2011 |
| WO | 2011/137895 A2 | 11/2011 |
| WO | 2011/149624 A1 | 12/2011 |
| WO | 2012/006479 A2 | 1/2012 |
| WO | 2012/020277 A1 | 2/2012 |
| WO | 2012/022532 A1 | 2/2012 |
| WO | 2012/038497 A2 | 3/2012 |
| WO | 2012/051156 A2 | 4/2012 |
| WO | 2012/051973 A1 | 4/2012 |
| WO | 2012/097286 A1 | 7/2012 |

OTHER PUBLICATIONS

JP2009-016217 (Shigematsu et al. Abstract translation), Redox flow battery system, and operation method thereof.*

JP2006-351346 (Ueno et al. Abstract translation), Redox flow battery system.*

WO 2008/148148 A1 (Skyllas-Kazacos), Efficient energy storage systems using vanadium redox batteries fir electricity trading, fossil fuel reduction and electricity power cost savings for consumers, Dec. 11, 2008.*

Shah et al., A dynamic performance model for redox-flow batteries involving soluble species, Electrochimica Acta 53 (2008) 8087-8100).*

Zhipeng et al., Cerium-zinc redox flow battery: Positive half-cell electrolyte studies, Journal of Rare Earths, vol. 29, No. 6, Jun. 2011, p. 567.*

JP2009-016217 (Shigematsu et al. Abstract translation), Redox flow battery system, and operation method thereof, Jan. 22, 2009.*

JP2006-351346 (Nohayashi et al., Abstract translation), Redox flow battery system, Dec. 28, 2006.*

CN 101968532 (Guan et al., Derwent), In situ monitoring method for state of charge of positive electrolyte of full-vanadium redox flow battery, involves extracting batch of positive electrolyte with constant temperature and different charge and discharge time. Feb. 9, 2011.*

International Preliminary Report on Patentability issued in International Application No. PCT/US2012/021095, having a mailing date of Jul. 25, 2013.

International Search Report & Written Opinion issued PCT Application No. PCT/US2012/031174, mailed on Nov. 7, 2012.

Office Action issued by the State Intellectual Property Office of the People's Republic of China; Chinese application No. 200980126611.8; issued on Jan. 14, 2013.

International Preliminary Report on Patentability issued in International Application No. PCT/US2011/063787, having a mailing date of Jun. 20, 2013.

International Preliminary Report on Patentability issued in International Application No. PCT/US2012/020656, having a mailing date of Jun. 18, 2013.

International Preliminary Report on Patentability issued in International Application No. PCT/US2012/020668, having a mailing date of Jun. 18, 2013.

International Search Report & Written Opinion issued in PCT Application No. PCT/US2011/063787, mailed on Jul. 30, 2012.

International Preliminary Report on Patentability issued in International Application No. PCT/US2012/031174, having a mailing date of Oct. 10, 2013.

(56) References Cited

OTHER PUBLICATIONS

International Search Report & Written Opinion issued in PCT Application No. PCT/US2009/049789, mailed on Feb. 25, 2010.
International Preliminary Report on Patentability issued in PCT Application No. PCT/US2009/049789, mailed on Jan. 20, 2011.
International Search Report & Written Opinion issued in PCT Application No. PCT/US2012/020656, mailed on Jun. 27, 2012.
International Search Report & Written Opinion issued in PCT Application No. PCT/US2012/020668, mailed on Jun. 27, 2012.
International Search Report & Written Opinion issued in PCT Application No. PCT/US2012/021095, mailed on Jun. 27, 2012.
Sano, Noriaki, et al. "Synthesis of carbon nanotubes in graphite microchannels in gas-flow and submerged-in-liquid reactors"; Materials Chemistry and Physics; vol. 122; pp. 474-479; Apr. 18, 2010.
Chieng, S.C. et al., "Modification of Daramic, mircoporous separator, for redox flow battery applications"; Univ. New South Wales, School of Chemical Eng. Industrial Chemistry, Kensington N.S.W. 2033, Australie; vol. 75; No. 1-2; pp. 81-91; 1992.
Codina, G. et al., "Development of a 0.1 kW power accumulation pilot plant based on a Fe/Cr redox flow battery Part 1. Considerations on flow-distribution design"; Journal of Power Sources; vol. 48; pp. 293-302; Jul. 23, 1993.
Codina, G. et al., "Scale-up studies of an Fe/Cr redox flow battery based on shunt current analysis"; Journal of Applied Electrochemistry; vol. 22; pp. 668-674; Sep. 1, 1991.
Cunningham, Brent et al., "Development of bipolar plates for fuel cells from graphite filled wet-lay material and a thermoplastic laminate skin layer"; ScienceDirect; Journal of Power Sources; vol. 165; pp. 764-773; Aug. 7, 2006.
Cunningham, Brent; "Development of Compression Moldable Polymer Composite Bipolar Plates for Fuel Cells"; Virginia Polytechnic Institute and State University Dissertation; Macromolecular Science and Engineering; Feb. 5, 2007.
Demopoulos, George et al., "New Technologies for HCl Regeneration in Chloride Hydrometallurgy"; World of Metallurgy—ERZMETALL 61; No. 2; 2008.
Dolle, Mickael et al., "Synthesis of nanosized zirconium carbide by a sol-gel route"; Journal of European Ceramic Society; ISSN 0955-2219; 2007.
Erkoc, E. et al., "Effect of pulsed flow on the performance of carbon felt electrode"; Chemical Engineering Journal; vol. 85; pp. 153-160; Feb. 7, 2001.
Faith, Khalid et al., "Advancements in the Direct Hydrogen Redox Fuel Cell"; Electrochemical and Solid-State Letters; 11 (2) B11-B15; Aug. 16, 2007.
Fedkiw, Peter et al., "Mathematical Model for the Iron/Chromium Redox Battery"; Department of Chemical Engineering, North Carolina State University, Admittance Study of The Pb Electrode; Apr. 1984.
Friedrich J.M. et al., "Reticulated vitreous carbon as an electrode material"; Journal of Electroanalytical Chemistry; Apr. 10, 2003.
Gahn, Randall et al., "Cycling Performance of the Iron-Chromium Redox Energy Storage System"; National Aeronautics and Space Administration; Cleveland, Ohio; Aug. 18-23, 1985.
Gahn, Randall et al., "Preformance of Advanced Chromium Electrodes for the NASA Redox Energy Storage System"; National Aeronautics and Space Administration; Cleveland, Ohio; Nov. 1981.
Gahn, Randall et al., "Single Cell Preformance Studies on the Fe/Cr Redox Energy Storage System using Mixed Reactant Solutions at Elevated Temperature"; Intersociety Energy Conversion Engineering Conference; vol. 4; Aug. 21-26, 1983.
Giner, J. et al., "Advanced Screening of Electrode Couples"; National Aeronautics and Space Administration; Cleveland, Ohio; Feb. 1980.
Giner, J. et al., "Screening of Redox Couples and Electrode Materials"; Giner, Inc., National Aeronautics and Space Administration; Cleveland, Ohio; Sep. 1976.
Gonzalez-Garcia, Jose et al., "Hydrodynamic Behavior of a Filter-Press Electrochemical Reactor with Carbon Felt as a Three-Dimensional Electrode"; American Chemical Society; vol. 37; pp. 4501-4511; 1998.
Gonzalez-Garcia, Jose et al., "Characterization of a carbon felt electrode: structural and physical properties"; Journal of Materials Chemistry; Received Jul. 27, 1998, Accepted Nov. 13, 1998.
Hagg, Ch. M. et al., "Novel bipolar electrodes for battery applications"; Journal of Applied Electrochemistry; vol. 32; pp. 1063-1069; Received Apr. 5, 2001; accepted in revised form Jun. 12, 2002.
Hamamoto, Osamu et al., "Research and Development of 10kw Class Redox Flow Battery"; NEDO; Proceedings of the 20th Intersociety Energy Conversion Engineering Conference; vol. 2; Aug. 1985.
Hodgson, Isaac; "Pressure Drop, Liquid Holdup and Mass Transfer in a Graphite Fiber Bed with Upward Co-Current Gas-Liquid Flow"; B. Sc (Hons) University of Science and Technology; Ghana; Aug. 1993.
Hollax, E. et al., "The Influence of Oxidative Pretreatment of Graphite Electrodes on the Catalysis of the Cr3/Cr2 and Fe2/Fe2 Redox Reactions"; Carbon; vol. 23; No. 6; pp. 655-664; Received Oct. 8, 1984; Revised Dec. 17, 1984.
Inoue, M. et al., "Carbon Fiber Electrode for Redox Flow Battery"; Journal of the Electrochemical Society; Accelerated Brief Communications; Mar. 1987.
Izawa, Hidetaka, "Research and Development of 10kw Class Redox Flow Battery"; 21st Intersociety Energy Conversion Engineering Conference; Advancing Toward Technology Breakout in Energy Conversion; Aug. 25-29, 1986.
Jain, Anubhav, "Systhesis and Processing of Nanocrystalline Zirconium Carbide Formed by Carbothermal Reducation"; A Thesis presented to The Academic Faculty; Georgia Institute of Technology; Aug. 2004.
Jalan, Vinod et al., "Optimization and Fabrication of Porous Carbon Elecrodes for Fe/Cr Redox Flow Cells"; U.S. Department of Energy Conservation and Renewable Energy Division of Energy Storage Systems; Jul. 1982.
Jalan, Vinod et al., "Requirements for Optimization of Electrodes and Electrolyte for the Iron/Chromium Redox Flow Cell"; National Aeronautics and Space Administration; Sep. 1981.
Joerissen, Ludwig et al., "Possible use of vanadium redox-flow batteries for energy storage in small grids and stand-alone photovoltaic systems"; Science Direct ; Journal of Power Sources; vol. 127; pp. 98-104; 2004.
Johnson, David et al., "Chemical and Electrochemical Behavior of the Cr(III)/Cr(II) Half-Cell in the Iron-Chromium Redox Energy Storage System"; J. Electrochem. Soc.; Electrochemical Science and Technology; May 1985.
Jones, Janet et al., "Ligand Bridging in the Oxidation of Chromium (II) at Mercury Electrodes"; California Institute of Technology; Pasadena, CA; Jan. 24, 1964.
Kim, Jun Gyu et al., "Microstructure and mechanical properties of chemical vapor deposited ZrC film on SiC/graphite substrate"; Journal of Ceramic Processing Research; vol. 10; No. 1; pp. 21-24; 2009.
Kuhn, A.T. et al., "Electrical leakage currents in bipolar cell stacks"; Journal of Applied Electrochemisty; vol. 10; pp. 233-237; Mar. 27, 1979.
Lampitt, L.H. et al., "The photochemical oxidation of ascorbic acid in solutions containing oxalic acid. II—Mechanisn of the reaction"; Journal of the Science of Food and Agriculture; vol. 7; issue 2; pp. 120-124; http://onlinelibrary.wiley.com; published online May 8, 2006.
Leong, Chia-ken et al., "Pressure Electrical Contact Improved by Carbon Black Paste"; Journal of Electronic Materials; vol. 33; No. 3; 2004.
Lopez-Atalaya, M. et al., "Behavior of the Cr(III)/Cr)II) reaction on fold-graphite electrodes. Application to redox flow storage cell"; Journal of Power Sources; vol. 35; pp. 225-234; Oct. 5, 1990.
Lopez-Atalaya, M. et al., "Optimization studies on a Fe/Cr redox flow battery"; Journal of Power Sources; vol. 39; pp. 147-154; Nov. 15, 1991.
Cnobloch, H et al., "Redox Ion Flow Cell for Solar Energy Storage"; Siemens Forsch—u.ENtwickl.-Ber. Bd. 12; 1983.
Mayer, Peter et al., "Electocatalysis of redox reactions by metal nanoparticles on graphite electrodes"; Journal of Solid State Electrochem; vol. 5; pp. 402-411; published online May 16, 2001.
Middelman, E. et al., "Bipolar plates for PEM fuel cells"; Science Direct; Journal of Power Sources; vol. 118; pp. 44-46; 2003.

(56) References Cited

OTHER PUBLICATIONS

Mohammadi, Touraj et al., "Modification of a Composite Membrane for Redox Flow Battery Applications"; Iranian Palyn er Animal I, vol. 6, No. I; School of Chem. Eng. and Ind. Chem.; Unvi. Of New South Wales; Received Apr. 2, 1996, accepted Nov. 17, 1996.

Mohammadi, F. et al., "Overcharge in the vanadium redox battery and changes in electrical resistivity and surface functionality of graphite-felt electrode"; Journal of Power Sources; vol. 52; pp. 61-68; Received Feb. 2, 1994; accepted Apr. 25, 1994.

Muller, A. et al., "Injection moulding of graphite composite bipolar plates"; Science Direct; Journal of Power Sources; vol. 154; pp. 467-471; available online Dec. 28, 2005.

Nava, J.L. et al., "Mass Transport and Potential Studies in a Flow-through Porous Electrode Reactor. A Comparative Study of Reticulated Vitreous Carbon and Graphite Felt Used as Cathode"; Portugaliae Electrochimica Acta ISSN 1647-1571; Nov. 20, 2008.

Noah, Karl et al., "Hydrogen Reduction of Ferric Ions for Use in Copper Electrowinning"; Idaho National Engineering and Environmental Laboratory; Jan. 2005.

Nozaki, Ken et al., "Performance of ETL 1 KW Redox Flow Cell"; 18$^{th}$ Intersociety Energy Conversion Engineering Conference; vol. 4; Aug. 21-26, 1983.

Nozaki, Ken et al., "Performance of ETL new 1 KW Redox Flow Cell System"; 19th Intersociety Energy Conversion Engineering Conference; vol. 2; Aug. 19-24, 1984.

Nozaki, Ken et al., "Research and Development of Redox-Flow Battery"; 17th Intersociety Energy Conversion Engineering Conference; Aug. 8-12, 1982.

Oei, Djong-Gie, "Permeation of vanadium cations through anionic and cationic membranes"; Journal of Applied Electrochemistry; vol. 15; No. 2; pp.-231-235; Mar. 1985.

Ozdemir, T. et al., "Treatment of Waste Picking Liquors: Process Synthesis and Economic Analysis"; Chemical Engineering Communications; VOI. 193; Issue 5; May 2006.

Pecsok, R.L. et al., "Metal Ammine Formation in Solution XI. Stability of Ethylenediamine complexes and the Coordination Number of Chromium (II)"; Univ. of Denmark; Acta Chem. Scand.; vol. 11; No. 8; 1957.

Petrii, O.A. et al., "The nature of anomalous cathodic behavior of metals with high hydrogen overpotential: thallium in acidic solutions"; Russian Journal of Electrochemistry; vol. 31; pp. 921-929; 1995.

Ponce De Leon, C. et al., "Redox flow cells for energy conversion"; Science Direct; Journal of Power Sources; vol. 60; pp. 716-732; Oct. 19, 2005.

O'Donnell, Patricia et al., "The Redox Flow System for Solar Photovoltaic Energy Storage"; E-9006; STAR Category 44; National Aeronautics and APACE Administration; Lewis Research Center; Cleveland, Ohio; 1976.

Extended European Search Report issued in European Application No. 09795056, having a mailing date of Mar. 31, 2014.

European Search Report issued in European Application No. 12762830 (PCT/US2012/031174) mailed on Aug. 6, 2014.

Shah et al., A Dynamic Performance Model for Redox-Flow Batteries Involving Soluble Species, Electrochimica Acta 53 (2008) 8087-8100, Elsevier. Jun. 2 2008.

Hagedorn, "NASA Redox Storage System Development Project", U.S. Department of Energy Conservation and Renewable Energy Division of Energy Storage Systems, Final Report, Oct. 1984.

Miyake et al., "Potentiostatic Electrodeposition of Pt Nanoparticles on Carbon Black", Journal of The Electrochemical Society, J. Electrochem. Soc. 2011, vol. 158, Issue 9, pp. D590-D593.

\* cited by examiner

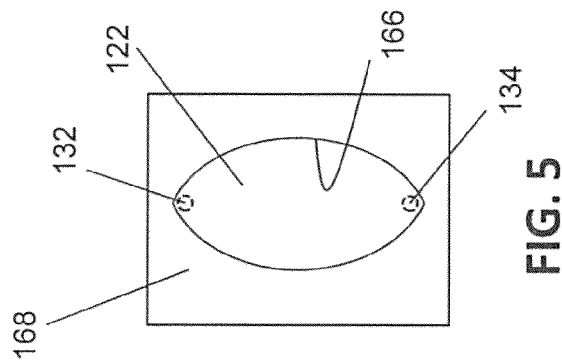
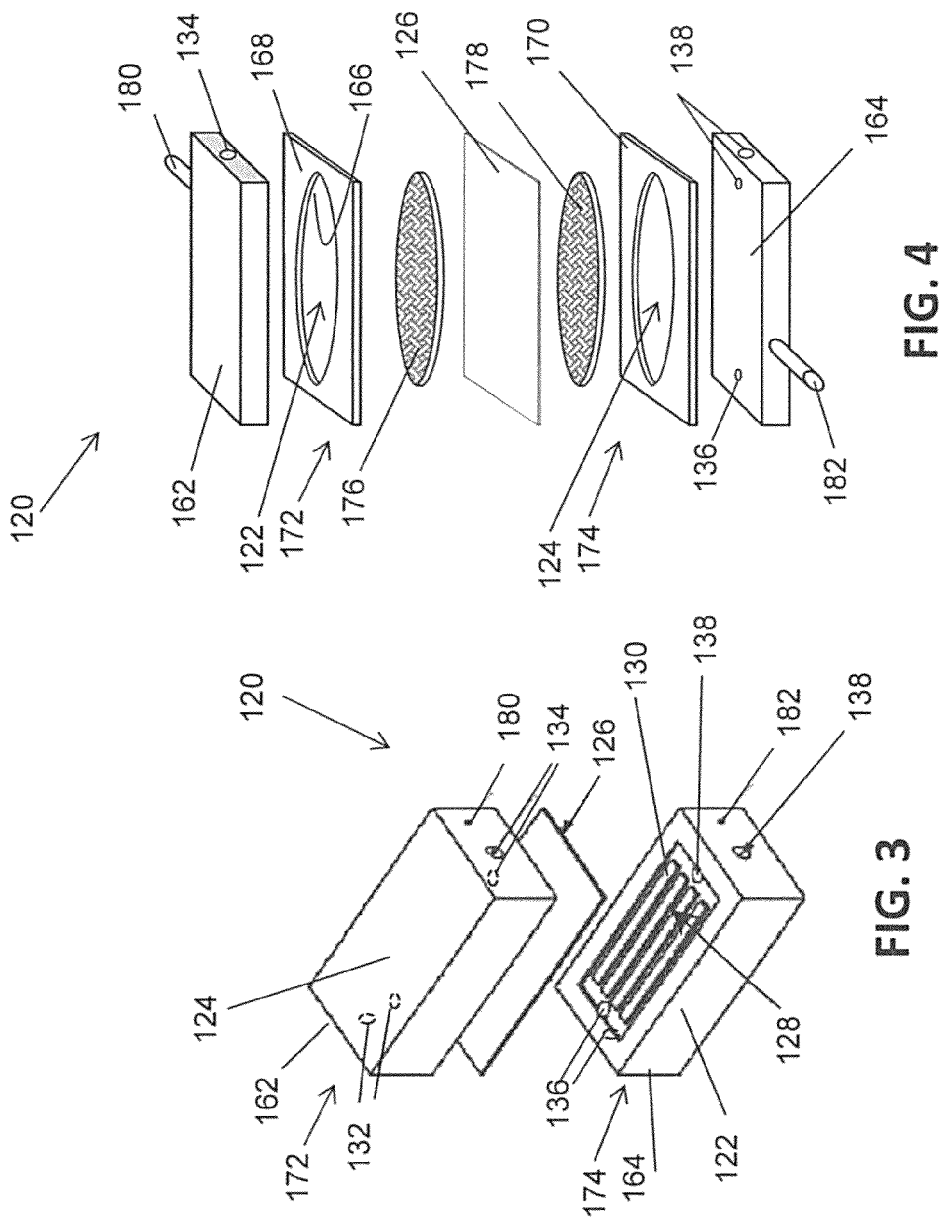
FIG. 5
FIG. 4
FIG. 3

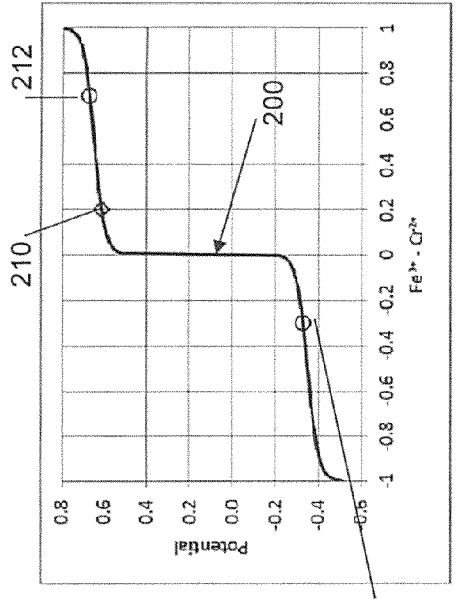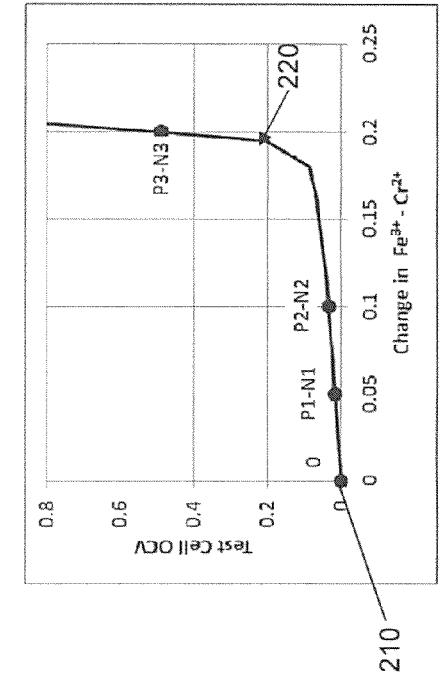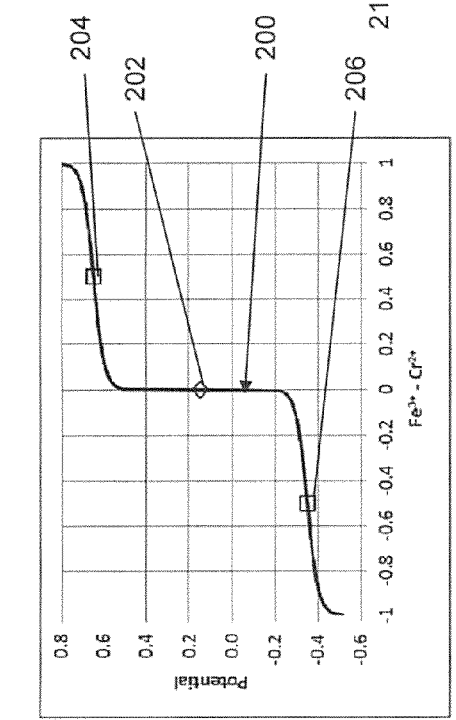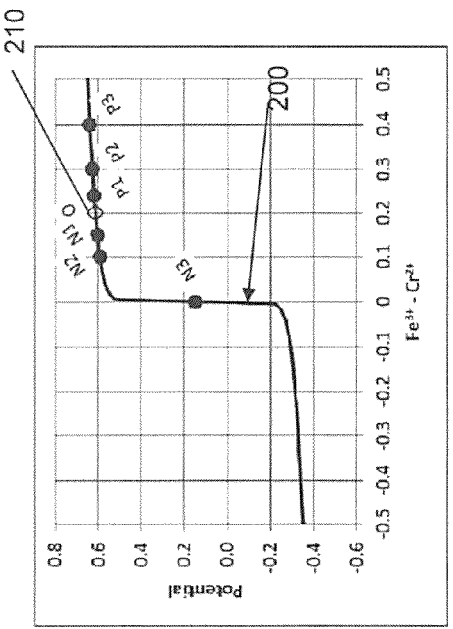
FIG. 7A
FIG. 7B
FIG. 7C
FIG. 7D

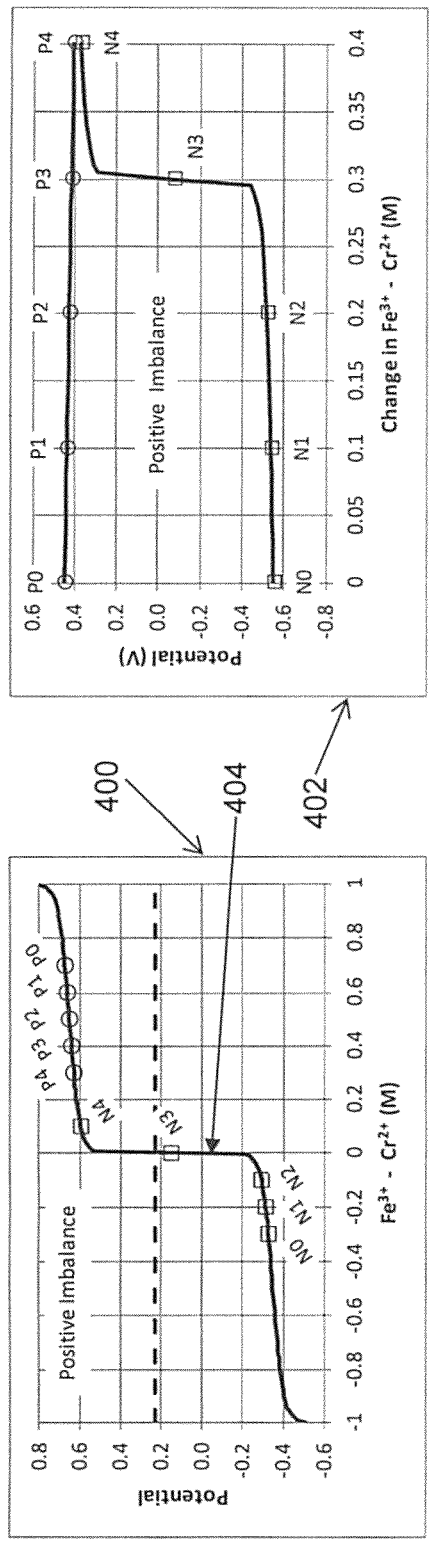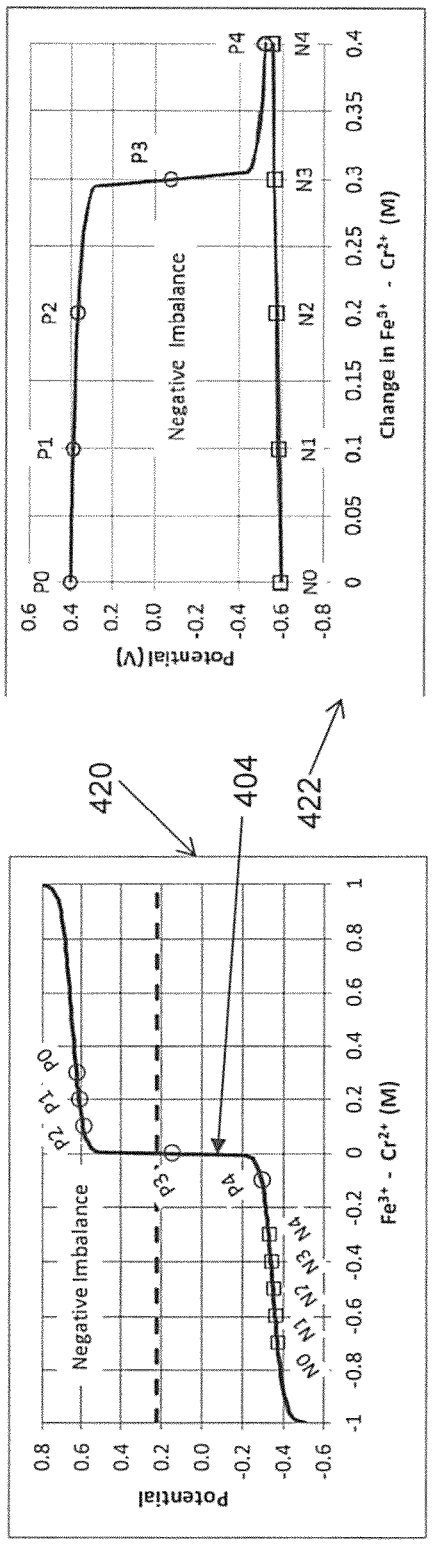

MONITORING ELECTROLYTE CONCENTRATIONS IN REDOX FLOW BATTERY SYSTEMS

RELATED APPLICATIONS

This application claims the benefit of priority to U.S. Provisional Patent Application No. 61/468,733, filed Mar. 29, 2011, the entire contents of which are incorporated herein by reference.

STATEMENT REGARDING FEDERALLY SPONSORED RESEARCH

Inventions included in this patent application were made with Government support under DE-OE0000225 "Recovery Act—Flow Battery Solution for Smart Grid Renewable Energy Applications" awarded by the US Department of Energy (DOE). The Government has certain rights in these inventions.

FIELD OF THE INVENTION

This invention generally relates to reduction-oxidation (redox) flow batteries and more particularly to monitoring and characterizing reactant concentrations in liquid flow battery electrolytes.

BACKGROUND

Flow batteries are electrochemical energy storage systems in which electrochemical reactants are dissolved in liquid electrolytes (sometimes referred to generically as "reactants"), which are pumped through reaction cells where electrical energy is either converted to or extracted from chemical potential energy in the reactants by way of reduction and oxidation reactions. In applications where megawatts of electrical energy must be stored and discharged, a redox flow battery system may be expanded to the required energy storage capacity by increasing tank sizes and expanded to produce the required output power by increasing the number or size of electrochemical cells or cell blocks. A variety of flow battery chemistries and arrangements are known in the art.

In some redox flow battery systems based on the Fe/Cr redox couple, the catholyte (in the positive half-cell) contains $FeCl_3$, $FeCl_2$ and HCl. The anolyte (in the negative half-cell) contains $CrCl_3$, $CrCl_2$ and HCl. Such a system is known as an "unmixed reactant" system. In a "mixed reactant" system, the anolyte also contains $FeCl_2$ and the catholyte also contains $CrCl_3$. In an initial state of either case, the catholyte and anolyte typically have equimolar reactant concentrations.

After a number of charge/discharge cycles, the catholyte and anolyte may become imbalanced because of side reactions during a charge and/or discharge operations. For example, in the case of an Fe/Cr redox flow battery, a hydrogen generation side-reaction occurs at the anode during the charge cycle. Such side reactions cause an imbalance in electrolyte concentrations by converting more reactant in one half-cell to a higher SOC state than occurs in the second electrolyte. In this unbalanced state, for example, the concentration of $Fe^{3+}$ may be higher than that of $Cr^{2+}$. The imbalance decreases capacity of the battery and is undesirable. The proportion of hydrogen gas generated, and thus the degree of reactant imbalance, also increases as the state-of-charge (SOC) of the flow battery increases.

The imbalanced state may be corrected by processing the catholyte in a rebalancing cell. One example is an Iron/Hydrogen fuel cell as described in U.S. Pat. No. 4,159,366, which describes an electrolytic rebalance cell configured to oxidize waste hydrogen at a rebalance cell anode and reduce excess $Fe^{3+}$ ions to $Fe^{2+}$ ions at a rebalance cell cathode. $H_2$ may be recycled from the Cr species electrolyte and directed into the rebalance cell along with a portion of the Fe electrolyte. A catalyst may be used to promote the reaction with or without application of an applied voltage. Another example of a similar cell is provided in "Advancements in the Direct Hydrogen Redox Fuel Cell" by Khalid Fatih, David P. Wilkinson, Franz Moraw, Alan Ilicic and Francois Girard, published electronically by the Electrochemical Society Nov. 26, 2007.

Monitoring or measuring the state of charge and the imbalance of electrolytes presents additional challenges. Such concentrations may be measured spectroscopically, as described for example in U.S. Pat. No. 7,855,005 to Sahu, or by any number of other methods.

SUMMARY

In one embodiment method, a degree of electrolyte imbalance in a reduction-oxidation (redox) flow battery system is determined by introducing a first liquid electrolyte into a first chamber of a test cell; introducing a second liquid electrolyte into a second chamber of the test cell; measuring a voltage of the test cell; measuring an elapsed time from the test cell reaching a first voltage until voltage test end-point is reached; and determining a concentration of at least one reactant in the first and second liquid electrolytes based on the elapsed time.

In another embodiment, an electronic controller has a processor and has a non-transitory computer-readable medium coupled to the processor and containing processor-executable instructions to perform operations for introducing a first liquid electrolyte into a first chamber of a test cell, introducing a second liquid electrolyte into a second chamber of the test cell, measuring a voltage of the test cell, measuring an elapsed time from the test cell reaching a first voltage until voltage test end-point is reached, and determining a concentration of at least one reactant in the first and second liquid electrolytes based on the elapsed time.

In an additional embodiment, a reduction-oxidation (redox) flow battery system has a redox flow battery, a test cell fluidically coupled to the flow battery, and the electronic controller for monitoring and controlling the test cell.

BRIEF DESCRIPTION OF DRAWINGS

The accompanying drawings, which are incorporated herein and constitute part of this specification, illustrate exemplary embodiments of the invention, and together with the general description given above and the detailed description given below, serve to explain the features of the invention.

FIG. 3 is an exploded view of one embodiment of an electrolyte monitoring test cell.

FIG. 4 is an exploded view of another embodiment of an electrolyte monitoring test cell.

FIG. 5 is a plan view of a chamber layer of the electrolyte monitoring test cell embodiment of FIG. 4.

FIG. 7A is a graph of electrolyte potential vs. concentration difference for an Fe/Cr flow battery system, with points illustrating a balanced electrolyte solution.

FIG. 7B is a graph of electrolyte potential vs. concentration difference for an Fe/Cr flow battery system, with points illustrating a positively unbalanced electrolyte solution.

FIG. 7C is a graph of electrolyte potential vs. concentration difference for an Fe/Cr flow battery system, with points illustrating charging of an unbalanced electrolyte solution.

FIG. 7D is a graph of test cell OCV vs. change in concentration difference for an Fe/Cr flow battery system, with points illustrating charging of an unbalanced electrolyte solution.

FIG. 10A is a graph illustrating a graph of electrolyte potential vs. concentration difference for an Fe/Cr flow battery system, with points illustrating a process for measuring a reactant concentration using a reference electrode.

FIG. 10B is a graph illustrating potential versus change in concentration difference for the process of FIG. 10A.

FIG. 10C is a graph illustrating a graph of electrolyte potential vs. concentration difference for an Fe/Cr flow battery system, with points illustrating a process for measuring a reactant concentration using a reference electrode.

FIG. 10D is a graph illustrating potential versus change in concentration difference for the process of FIG. 10C.

DETAILED DESCRIPTION

Introduction and Definitions

Figure 1:
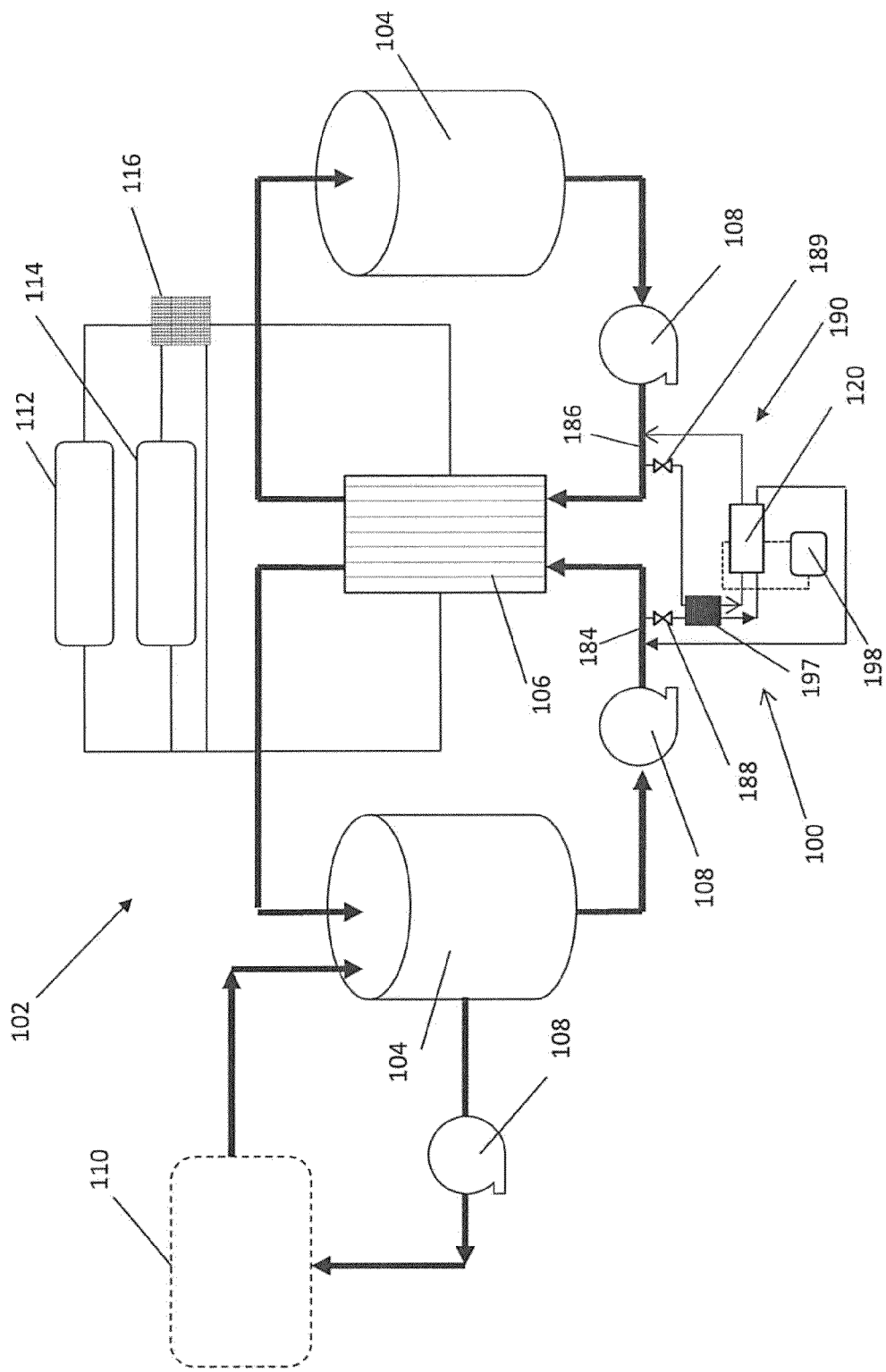
FIG. 1 is a schematic illustration of a redox flow battery system including an electrolyte monitoring system according to one embodiment.

As used herein, the phrase "state of charge" and its abbreviation "SOC" refer to the ratio of stored electrical charges (measured in ampere-hour) to charge storage capacity of a complete redox flow battery system. In particular, the terms "state of charge" and "SOC" may refer to an instantaneous ratio of usable charge stored in the flow battery to the full ideal charge storage capacity of the flow battery system. In come embodiments, "usable" stored charge may refer to stored charge that may be delivered at or above a threshold voltage (e.g. about 0.7 V in some embodiments of an Fe/Cr flow battery system). In some embodiments, the ideal charge storage capacity may be calculated excluding the effects of unbalanced electrolytes.

As used herein the phrase "state of oxidation" and its abbreviation "SOO" refer to the chemical species composition of at least one liquid electrolyte. In particular, state of oxidation and SOC refer to the proportion of reactants in the electrolyte that have been converted (e.g. oxidized or reduced) to a "charged" state from a "discharged" state. For example, in a redox flow battery based on an iron/chromium (Fe/Cr) redox couple, the state of oxidation of the catholyte (positive electrolyte) may be defined as the percent of total Fe which has been oxidized from the ferrous iron ($Fe^{2+}$) form to the ferric iron ($Fe^{3+}$) form and the state of oxidation of the anolyte (negative electrolyte) may be defined as the negative percent of total Cr which has been reduced from the $Cr^{3+}$ form to the $Cr^{2+}$ form. Although many of the embodiments herein are described with reference to an Fe/Cr flow battery chemistry, it should be appreciated with the benefit of the present disclosure that some embodiments are applicable to flow battery systems (and some hybrid flow battery systems) using other reactants.

In some embodiments, the state of oxidation of the two electrolytes may be changed or measured independent of one another. Thus, the terms "state of oxidation" and "SOO" may refer to the chemical composition of only one electrolyte, or of both electrolytes in an all-liquid redox flow battery system. The state of oxidation of one or both electrolytes may also be changed by processes other than desired charging or discharging processes. For example, undesired side reactions may cause oxidation or reduction of active species in one electrolyte without producing a corresponding reaction in the second electrolyte. Such side reactions may cause the respective SOCs of the positive and negative electrolytes to become imbalanced such that one electrolyte has a higher effective SOC than the other.

For an Fe/Cr redox flow battery, the SOO of the positive electrolyte may be defined as the ratio of the concentration of $Fe^{3+}$ in the electrolyte to the total concentration of Fe (i.e. the sum of $Fe^{3+}$ and $Fe^{2+}$ concentrations) in the electrolyte. Similarly, the SOO of the negative electrolyte is defined as the ratio of the concentration of $Cr^{2+}$ in the electrolyte to the total concentration of Cr (i.e. the sum of $Cr^{3+}$ and $Cr^{2+}$ concentrations) and may be expressed as a negative number. In equation form, these are:

$$SOO_{pos} = Fe^{3+}/(Fe^{3+}+Fe^{2+}) \quad [1]$$

$$SOO_{neg} = -Cr^{2+}/(Cr^{2+}+Cr^{3+}) \quad [2]$$

Unequal Mixed Reactant

Flow battery electrolytes may be formulated such that in both positive and negative electrolytes are identical in a fully discharged state. Such a system may be referred to as a "mixed reactant" system, an example of which is described in U.S. Pat. No. 4,543,302. In some embodiments, a mixed reactant electrolyte that contains unequal concentrations of $FeCl_2$ and $CrCl_3$ in the initial electrolyte (fully discharged) may be used to minimize the inequality in concentrations of $CrCl_2$ and $FeCl_3$, and to mitigate $H_2$ evolution during operation of a flow battery system. One example of the composition in the fully discharged state is 1M $FeCl_2$/1.1M $CrCl_3$/2-3M HCl. In such embodiments, the concentration of $CrCl_3$ is intentionally made higher than that of $FeCl_2$ in an initially-prepared and fully-discharged electrolyte solution. Upon charge, the SOO of $CrCl_2$ will be lower than that of $FeCl_3$, thereby avoiding high SOO conditions at the Cr electrode where $H_2$ evolution is a greater problem. With this unequal mixed reactant, the Fe electrode may be charged to nearly 100% while the Cr electrode may be charged to a lower SOO.

The Fe ionic species ($Fe^{3+}$, $Fe^{2+}$) at the positive electrode have a total concentration $Fe_t = Fe^{3+} + Fe^{2+}$. Correspondingly, the Cr ionic species ($Cr^{3+}$, $Cr^{2+}$) at the negative electrode have a total concentration $Cr_t = Cr^{3+} + Cr^{2+}$. In embodiments of an unequal mixed reactant electrolyte, $Fe_t$ does not equal $Cr_t$, and the concentration of ionic species $Fe^{3+}$, $Fe^{2+}$, $Cr^{3+}$ and $Cr^{2+}$ vary widely with SOO.

The rate of $H_2$ evolution is enhanced at more negative potentials, which occurs as the Cr electrode becomes more fully charged. During charge, the ratio of the concentration of $Cr^{2+}$ to the concentration of $Cr^{3+}$ (i.e. $Cr^{2+}/Cr^{3+}$) increases, which is reflected in the more negative potential of the Cr electrode. By adding excess $Cr^{3+}$, this ratio will be lower and the potential of the Cr electrode will be less negative and $H_2$ evolution will be mitigated.

For example, the maximum charge that may be inputted to a cell with a mixed reactant with unequal concentrations of $FeCl_2$ and $CrCl_3$ at 0% SOO (fully discharged) of 1M $FeCl_2$/1.1M $CrCl_3$/2M HCl is limited by the lower concentration of the electroactive species in the anolyte or catholyte. In this case, the lower concentration is 1M $FeCl_2$. The effect of excess $CrCl_3$ on SOO may be seen in the following example. During charge, if nearly the entire 1M $FeCl_2$ is oxidized to $FeCl_3$, then PosSOO is nearly 100%. At the same time approximately the same amount (1M) of $CrCl_3$ is reduced to $CrCl_2$, making the NegSOO approximately 91% (1.0/1.1). In this example, the maximum SOO of the unequal mixed reactant composition is a function of the excess amount of $CrCl_3$ and the concentration of $FeCl_2$.

In some embodiments, an unequal mixed reactant may also provide advantages with respect to cell voltage. The cell voltage calculated using a Nernst potential relationship is 1.104 V for a cell containing equimolar mixed reactant (i.e. 1M $FeCl_2$/1M $CrCl_3$/1M HCl) that is charged to 90% SOO.

This may be compared with a cell with an unequal mixed reactant containing an excess of $Cr^{3+}$ with a composition of 1M $FeCl_2$/1.1M $CrCl_3$/1M HCl. When the PosSOO is 90% for the positive electrode (Fe electrode), the negative electrode (Cr electrode) NegSOO is 81.8% and the cell voltage is 1.084 V. By adding a slight excess of $Cr^{3+}$, the cell voltage is lower by 20 mV and the SOO of the negative electrode is lower by about 8%. These two factors are beneficial for mitigating $H_2$ evolution at higher SOO, and help enhance energy efficiency.

Similar advantages may be achieved in flow battery electrolytes based on other redox couples in which parasitic side-reactions become increasingly likely as one electrode approaches a high SOO.

In some embodiments, if flow battery electrolytes contain unequal concentrations of total active materials, then a perfectly balanced pair of charged electrolytes will each contain equal amounts of both charged species (e.g., equal quantities of $Fe^{3+}$ and $Cr^{2+}$), but the SOO of the two electrolytes will be different. For example, in an unequal mixed reactant Fe/Cr flow battery, the total concentration of Fe may be less than the total concentration of Cr (e.g., total Fe=1.3 M and total Cr=1.4 M in some embodiments). In such a system, the absolute value of SOO of the negative electrolyte may be smaller than the absolute value of SOO of the positive electrolyte even when the charged species are in balance. For example, if $Cr^{2+}$ and $Fe^{3+}$ are both 0.7M, the SOO of the negative electrolyte is $-0.7/1.4=-0.50$; The SOO of the positive electrolyte is $0.7/1.3=0.54$.

The embodiments below include systems and methods for characterizing concentrations of dissolved reactant species in flow battery electrolytes, including systems and methods for quantifying electrolyte imbalance. Although many of the embodiments are described with reference to Fe/Cr flow batteries, the same principles and concepts may also be applied to other flow battery chemistries.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

As illustrated in FIG. 1, some embodiments of an electrolyte concentration monitoring system 100 may be integrated into a redox flow battery system 102. A redox flow battery system 102 such as that shown in FIG. 1 may include electrolyte tanks 104 fluidically joined to a flow battery stack assembly 106. In some embodiments, a redox flow battery system 102 may include four separate tank volumes that may be configured to keep charged electrolytes separated from discharged electrolytes. Such separated tank volumes may include four separate tanks or two tanks with dividers.

In some embodiments, a flow battery stack assembly 106 may include a plurality of electrochemical reaction cells configured for charging and discharging active species in the liquid electrolytes. Pumps 108 may be provided to pump electrolytes through the flow battery stack assembly 106 and any other connected systems, such as a rebalancing system 110 and/or an electrolyte concentration monitoring system 100. In some embodiments, the redox flow battery system 102 may be electrically connected to a power source 112 and/or an electric load 114. A main flow battery system controller 116 may also be provided to control the operation of the redox flow battery system 102, including the operation of pumps, valves, electrical connections, or any other electronic or electromechanical component within the redox flow battery system 102.

Iron/Chromium Flow Battery Electrochemistry

The valence state of the Fe and Cr ionic species in an Fe/Cr flow battery changes between charge and discharge. Information on the concentration of the ionic species may be needed to determine the state-of-charge (SOC) of the battery and the electrolyte balance of the anolyte and catholyte. In some embodiments, the electric potential of an Fe/Cr flow battery cell may be used to monitor the SOC of the battery. A higher voltage suggests that the battery SOC is higher. However, the voltage of a flow battery cell may be ambiguous in that there are four ionic species in an Fe/Cr flow battery ($Cr^{2+}$, $Cr^{3+}$, $Fe^{3+}$ and $Fe^{2+}$) that contribute to the cell voltage. In some embodiments, a more definitive measure of the SOC and concentration of the ionic species may be obtained by measuring the voltage of the anolyte and catholyte separately.

If charge and discharge are perfectly reversible, the cell is always in balance, with the same concentration of $Fe^{3+}$ in the catholyte as $Cr^{2+}$ in the anolyte. In reality, side reactions typically make the concentration of $Fe^{3+}$ in the catholyte higher than that of $Cr^{2+}$ in the anolyte. In this state, the system is said to be unbalanced and the energy storage capacity of the battery decreases. An unbalanced system must be appropriately rebalanced to regain the energy storage capacity. Insufficient rebalancing still leaves more $Fe^{3+}$ in the catholyte than $Cr^{2+}$ in the anolyte, leading to a condition that will be referred to herein as positive imbalance. Excessive rebalancing results in less $Fe^{3+}$ than $Cr^{2+}$ in the catholyte and anolyte respectively, leading to a condition that will be referred to herein as negative imbalance. In either case, the capacity of the cell is not fully regained.

In an ideal Fe/Cr redox flow battery, the overall electrochemical reaction during charging is:

$$Fe^{2+} + Cr^{3+} \rightarrow Fe^{3+} + Cr^{2+} \quad [3]$$

The Nernst equation gives the relationship between cell electric potential and electrolyte concentration.

$$E_{cell} = E^0 + (RT/nF) * \ln([Fe^{3+}][Cr^{2+}]/[Fe^{2+}][Cr^{3+}]) \quad [4]$$

In some embodiments, if the cell does not suffer from $H_2$ evolution or other side reactions, then the concentrations of $Fe^{3+}$ and $Cr^{2+}$ may be equal, and may be determined from the cell potential. However, with side reactions, the SOO of both catholyte and anolyte cannot be determined from cell potential measurement. To avoid issues related to the cell potential, separated half-cell redox potential measurements of the anolyte and catholyte may be made to determine the SOO of each electrolyte independently. Measuring the redox potential of the electrolyte may be carried out by using a reference electrode and an indicating electrode. Any suitable reference electrode, such as a calomel electrode or a silver-silver/chloride (Ag/AgCl) electrode may be used. Embodiments of suitable indicating electrodes include platinum, gold or carbon electrodes among others. These electrodes are all commercially available from Sensorex, for example.

In a measurement arrangement using both an indicating electrode and a reference electrode, the potential of the reference electrode is the same regardless of the concentration of various species in solution. But the potential of the indicating electrode varies linearly according to $\mathrm{Ln}([Fe^{3+}]/[Fe^{2+}])$ in the catholyte, and $\mathrm{Ln}([Cr^{2+}]/[Cr^{3+}])$ in the anolyte. However, measurements obtained using reference electrodes in a redox flow battery are subject to several sources of error and may be subject to measurement uncertainty on the order of 10 mV or more.

Introduction to Monitoring

To control a rebalancing reaction so that it proceeds to the correct extent, it is desirable to know the concentrations of the charged form of the active species in the electrolytes (e.g., $Fe^{3+}$ in the catholyte and $Cr^{2+}$ in the anolyte). It may be sufficient in some embodiments to know the difference between the concentration of $Fe^{3+}$ in catholyte, and that of $Cr^{2+}$ in the anolyte. A very small, ideally zero, difference is usually desired.

Various techniques for monitoring the concentrations of reactants dissolved in liquid electrolyte are available, including measuring properties of the electrolyte such as redox potential, refractive index, density, concentration (e.g. by spectroscopic analysis) or various combinations of these.

Test Cell Structure

Figure 2:
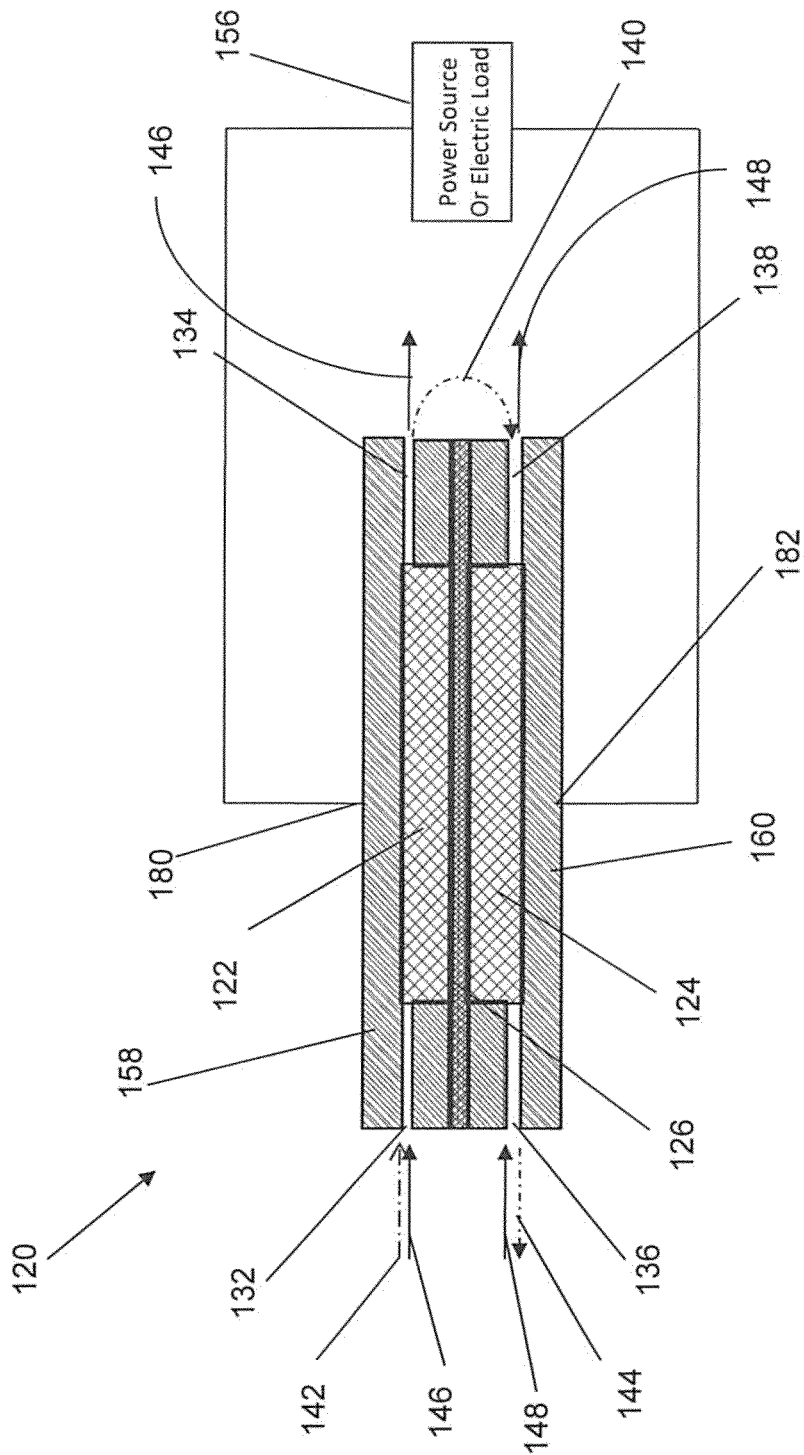
FIG. 2 is a cross-sectional view of one embodiment of an electrolyte monitoring test cell according to one embodiment.

In some embodiments, SOO and/or imbalance of electrolytes may be measured by placing electrolytes within a suitably configured test cell and monitoring changes in voltage, current, or other electrical quantities over time. A cross-sectional view of one embodiment of a test cell 120 is shown in FIG. 2. As shown in FIG. 2, some embodiments of a test cell 120 may include first and second electrolyte chambers 122, 124 with a separator membrane 126 in between. In some embodiments, each chamber 122, 124 may be substantially occupied by a porous, conductive material such as a carbon or graphite felt material. In alternative embodiments as illustrated in FIG. 3, the first and second electrolyte chambers 122, 124 may include shallow flow channels 128 separated by ribs 130 or any other structure configured to conduct electrons to and from the liquid electrolyte.

As shown in FIG. 2, the first electrolyte chamber 122 may include fluidic ports 132, 134 and the second electrolyte chamber 124 may include fluidic ports 136, 138, respectively, through which electrolyte may flow into and/or out of the respective electrolyte chamber 122, 124. In some embodiments, a pair of the fluidic ports 134, 138 may be joined by a fluid path 140 in fluid communication with one another such that electrolyte may be directed first as indicated at arrow 142 into the first electrolyte chamber 122 through fluidic port 132, out of the first electrolyte chamber 122 second through fluidic port 134 through fluid path 140, and third into the second electrolyte chamber 124 via fluidic port 138 before fourth exiting the test cell 120 via fluidic port 136 as indicated at arrow 144 in the second electrolyte chamber 124.

In alternative embodiments, electrolyte as indicated by arrows 146, 148 may be directed separately and in parallel respectively into fluidic ports 132, 136 and then out of fluidic ports 134, 138 as indicated by arrows 146, 148. Fluidic ports 132, 134, 136, 138 may take any form and may be any shape and size as desired to deliver electrolyte into and out of the electrolyte chambers 122, 124 of test cell 120.

In some embodiments, one or both electrolyte chambers 122, 124 may contain porous electrodes of carbon felt or other suitable flow-through electrode material. For example, any material that is conductive and inert in the electrolyte may be used as a porous or solid electrode that may be placed within or formed integrally with a portion of one or both cell chambers. In some embodiments, a surface of one or both electrodes may treated, plated or otherwise coated with a catalyst material selected to promote desired reactions or to suppress undesired reactions. A test cell 120 may also include electrical terminals 180, 182 for electrically connecting the test cell 120 to a power source or electric load 156. The test cell 120 may include one or more bipolar plates or terminal plates 158, 160 in contact with an electrode within the electrolyte chambers 122, 124, respectively.

FIGS. 3-4 illustrate exploded views of two embodiments of test cells 120. With particular reference to FIG. 4, a test cell 120 may include an upper body portion 162 and a lower body portion 164 that may be clamped, bolted, welded or otherwise sealed together, sandwiching a separator membrane 126 and any other desired components therebetween. In embodiments of a test cell 120 such as that shown in FIG. 4, the electrolyte chambers 122, 124 may be defined by cutouts 166 in a pair of removable chamber layers 168, 170. In some embodiments, the chamber layers 168, 170 may be made of a compressible gasket material, such as rubber or silicone. In other embodiments, chamber layers 168, 170 may be made of any other desired material, such as plastics or solid graphite. In some embodiments, chamber layers 168, 170 may be adhered to respective upper and lower body portions 162, 164. In other embodiments, chamber cavities may be machined, cast, molded or otherwise formed directly into the upper and lower body portions 162, 164, such as depicted in FIG. 3.

In some embodiments, the upper and lower body portions 162, 164 may be made of graphite, thus allowing upper and lower cell body halves 172, 174 themselves to be used as electrodes to measure the voltage of the test cell 120. In other embodiments, the upper and lower body portions 162, 164 may be made of any other material, electrical contact may be made with porous or other electrodes within the electrolyte chambers 122, 124. For example, the embodiment shown in FIG. 4 may include porous carbon felt electrodes 176, 178 configured to occupy the electrolyte chambers 122, 124.

In some embodiments, electrical terminals 180, 182 may be provided in electrical connection with each electrolyte chamber 122, 124. In some embodiments, if the entire cell body is conductive, the electrical terminals 180, 182 may be connected to the exterior of the cell body. Electrical terminals 180, 182 may be made of any suitable electrically conductive material. In some embodiments, each cell body half 172, 174 may include more than one electrode for measurement, charging, discharging or other purposes as will be described in further detail below.

As shown in FIG. 5, in some embodiments, the electrolyte chamber 122 may comprise an almond (or pointed oval) shape. The almond shape may facilitate flow conditions that may substantially prevent stagnation regions within the chamber 122 during flushing and filling of the test cell 120. In alternative embodiments, other chamber shapes may also be used In some embodiments, the volumes of the electrolyte chambers 122, 124 in a test cell 120 may be very small in order to shorten the measurement time. In some embodiments, the volumes of the two electrolyte chambers 122, 124 may be substantially equal to one another. The volume of each electrolyte chamber 122, 124 may be less than about 1 mL in some embodiments. In one particular embodiment, the volume of each electrolyte chamber 122, 124 may be about 0.8 mL. In other embodiments, the electrolyte chambers of a test cell may be larger or smaller as desired.

In some embodiments as shown in FIG. 3, ribs 130 in the electrolyte chambers 122, 124 may be used to further minimize electrolyte volume and/or to maintain the position of the separator membrane 126 such that the volumes of electrolyte in the two cell body halves 172, 174 are substantially the same. However, equal electrolyte volumes in the test cell 120 are not necessary in all embodiments. In some embodiments ribs 130 may be included in an almond-shaped electrolyte chamber. One function of the ribs 130 may be to increase reaction surface area and to decrease the distance that an ion has to diffuse to reach the electrode surface.

In some embodiments the separator membrane 126 of the test cell 120 may be of a porous material. In other embodiments, the separator membrane 126 may be an ion selective membrane, such as a cation exchange membrane or an anion exchange membrane. In some embodiments, the selection of the porosity and/or selectivity of a separator membrane 126 may depend on the active materials under evaluation among other factors.

In some embodiments, an electrolyte concentration monitoring system 100 for detecting an imbalance such as those described herein may be provided as a stand-alone system configured to be independent of any redox flow battery system 102. In other embodiments, an electrolyte concentration monitoring system 100 may be integrated into a redox flow battery system 102 as shown for example in FIG. 1. Various embodiments of flow-battery-integrated monitoring systems may be configured with different fluid delivery arrangements.

In some embodiments, a fluid delivery apparatus 190 may be provided to direct liquid electrolytes from a flow battery into the test cell 120. As shown in FIG. 1, in some embodiments a test cell 120 may be joined in fluid communication with electrolyte conduits 184, 186 downstream from electrolyte pumps 108. In such embodiments, valves 188, 189 may be provided to selectively direct electrolytes through the test cell 120 during normal pumping of electrolytes through the flow battery system 102. In alternative embodiments, fluidic connections for filling a test cell 120 may be independent of battery pumping apparatus. In some embodiments, a test cell fluid delivery apparatus may be configured to pump electrolytes directly from the tanks 104 into the test cell 120.

In some embodiments, a fluid delivery apparatus 190 may be configured to fill a test cell 120 by parallel flow as shown by the solid arrows 146, 148 in FIG. 2. In parallel filling, both electrolyte chambers 122, 124 may be filled substantially simultaneously, with electrolyte exiting the electrolyte chambers separately as indicated by solid arrows 146, 148. Alternatively, in some embodiments, if equal volumes of the two electrolytes are mixed, the test cell halves may be filled with the neutralized electrolyte in series as illustrated by the dashed arrows 142, 140, 144 in FIG. 2. During series filling, both electrolyte chambers 122, 124 may be filled in series by directing an outlet (fluidic port 134) of the first electrolyte chamber 122 into an inlet (fluidic port 138) of the second electrolyte chamber 124. A parallel filling arrangement may provide lower flow resistance, while a series filling arrangement may provide improved assurance of electrolyte flow through both electrolyte chambers 122, 224.

Figure 6B:
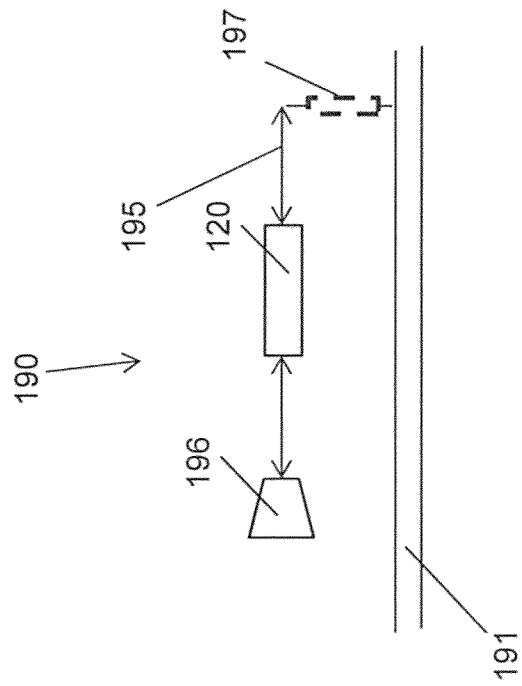
FIG. 6B is a schematic illustration of an embodiment of a reciprocating-flow fluid delivery system for an electrolyte monitoring system.
Figure 6A:
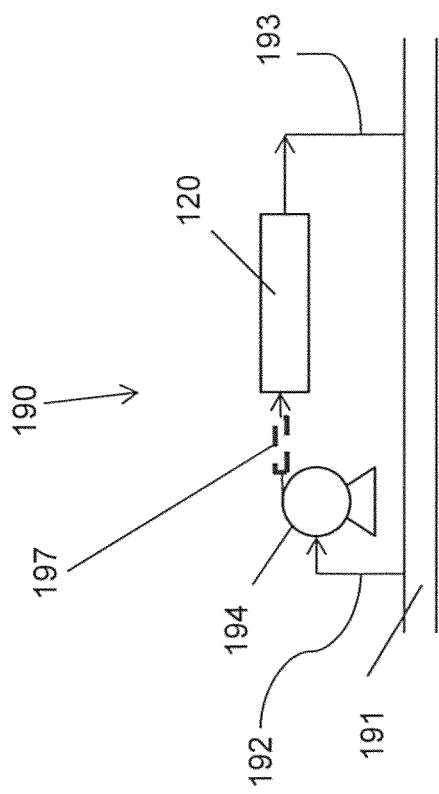
FIG. 6A is a schematic illustration of an embodiment of a through-flow fluid delivery system for an electrolyte monitoring system.

In some embodiments of a fluid delivery apparatus 190 as shown in FIG. 6A, the test cell 120 may be arranged in a through-flow configuration relative to an electrolyte flow conduit 191. In a through-flow configuration, the test cell 120 may include separate inlet and outlet flow lines 192, 193, both of which may be joined to an electrolyte flow conduit 191. In some embodiments, a flow-through arrangement may include one or more pumps 194 to pull electrolyte from the electrolyte conduit and to push electrolyte through the test cell 120. Any type of pump 194 may be used.

In some alternative embodiments, as shown for example in FIG. 6B, the test cell 120 may be arranged in a reciprocating flow arrangement relative to an electrolyte flow conduit 191. In a reciprocating flow arrangement, the electrolyte may be taken from one point in an electrolyte conduit 191 and returned to the same point via reciprocating flow line 195. In a reciprocating flow arrangement, a reciprocating pump 196, such as a syringe pump may be used. In some embodiments, the stroke volume of a syringe pump may be substantially larger than the volume of the cell chambers and the tubing combined to ensure that the cell will be completely filled with fresh electrolyte. FIGS. 6A-6B illustrate only one electrolyte flow channel for simplicity of illustration.

In some embodiments, in combination with any of the above-described fluidic arrangements, it may be desirable to mix positive and negative electrolytes prior to directing the neutralized electrolyte solution into the test cell 120. In such embodiments, an electrolyte mixing device 197 may be included to mix electrolytes prior to injecting neutralized electrolyte into the test cell 120. In some embodiments, an electrolyte mixing device may simply comprise a common section of electrolyte conduit. In other embodiments, electrolyte mixing devices 197 used in connection with a test cell filling apparatus may include any static or dynamic mixing device. In some embodiments, an electrolyte mixing device 197 may comprise a static mixer device such as those produced by Koflo Corp. (http://www.koflo.com/). In other embodiments, other static mixing structures, dynamic mixer bars or other mixing devices or structures may be used.

In some embodiments, an electrolyte concentration monitoring system 100 may include an electronic controller or electronic module 198 as shown for example in FIG. 1. An electronic module 198 may be configured to deliver an electrical current to the test cell in order to discharge and/or charge the electrolyte within the test cell 120 as described in more detail below. The electronic module 198 may also be configured to measure the open-circuit voltage (OCV) and/or the closed-circuit voltage (CCV) of the test cell at regular periodic time intervals. In some embodiments, an electronic module 198 may also be configured to control valves and/or a pump for filling the test cell 120. In further embodiments, an electronic module 198 may be configured to control an active mixing device or any other electronic or electromechanical component within the electrolyte monitoring system. An electronic module 198 may be electrically connected to the test cell 120 at electric terminals 180, 182 (e.g. in FIG. 3 and FIG. 4).

In some embodiments, an electronic module 198 may include or consist of an analog circuit and a micro-computer controller. In some embodiments, the analog circuit may include or consist of a controlled current source and a signal conditioning circuit for reading voltages.

In some embodiments, a micro-computer controller may comprise one or more analog input channels to measure OCV or potential and at least one digital input channel for operator interfacing. In some embodiments, a micro-computer controller may also comprise a plurality of digital output channels to control pumps, valves and/or other electromechanical components. A micro-computer controller may also include at least one communication port, such as an industrial standard RS232 or USB port, in order to allow for communication between the electronic module 198 and a main flow battery system controller 116. Examples of suitable micro-computer controllers include: the open source ARDUINO architecture (http://arduino.cc), TEENSY (http://pjrc.com/teensy), and BASIC STAMP (http://parallax.com). Any other suitable micro-computer controller may also be used. Alternatively, all functions of the electronic module 198 may be incorporated into components within the main flow battery system controller 116.

In some embodiments, an electronic module 198 of an imbalance and/or concentration monitoring system 100 may be controlled by the main flow battery system controller 116. In some embodiments, the electronic module 198 may be configured with two states, "stand-by" and "busy."

An example of an interaction between a main flow battery system controller 116 and an electronic module may include the following steps: (1) The main flow battery system controller 116 determines that the electronic module 198 is in standby mode, and then sends a command to the electronic module to begin a specified measurement process. (2) The electronic module 198 acknowledges receiving the command, and changes its state to "busy". (3) The electronic module 198 may then execute steps to carry out the specified measurement process. (4) On completion of the measurement process, the electronic module 198 may perform data reduction steps, and may transmit data back to the main flow battery system controller 116. (5) The electronic module 198 may then return to "standby" mode, at which point it stands ready to receive commands from the main flow battery system controller 116 to begin a new measurement process. Examples of various embodiments of measurement processes will now be described.

Coulometric Monitoring Methods

In some embodiments, the degree of imbalance of flow battery electrolytes (or the concentration of electrolyte reactants) may be measured by methods based on the concept of coulometric titration. Such methods are collectively referred to herein as coulometric methods. In some embodiments, coulometric methods of characterizing electrolyte reactant concentrations may generally benefit from mathematical relationships between charging or discharging time and electrolyte reactant concentrations as described below.

Various embodiments of coulometric methods may generally include placing approximately equal volumes of neutralized electrolyte (i.e. an electrolyte solution obtained by mixing together or substantially entirely discharging approximately equal volumes of positive and negative electrolyte) into the test cell and then applying a charging current to the test cell while monitoring test cell voltage. As will be described in further detail below, the degree of imbalance of the electrolytes may be determined by measuring the time that elapses between the moment a known charging current is initiated until a pre-determined stop-point (e.g., a pre-determined voltage) is reached.

In some embodiments, neutralized electrolyte may be obtained by mixing substantially equal volumes of the anolyte and catholyte. When equal volumes of the positive and the negative electrolyte are mixed, the SOO of the resultant electrolyte is the average of the two individual electrolytes. In some embodiments, mixing of electrolytes may be performed in a vessel or flow channel prior to injecting the mixed (neutralized) electrolyte solution into a test cell. Alternatively, any of the mixing devices described above or equivalents thereof may be used.

Thus, in some embodiments, equal volumes of positive and negative electrolyte may be mixed together and the neutralized electrolyte may be injected into the two sides of a test cell. In such embodiments, after injecting electrolytes into the test cell, the same neutralized electrolyte solution will be present in both half-cell chambers of the test cell.

In alternative embodiments, neutralized electrolyte may be obtained by electrochemically discharging the electrolytes without necessarily mixing them in a batch process. In these alternative embodiments, instead of mixing the electrolytes, some volume of the positive electrolyte may be pumped through one electrolyte chamber 122 (FIG. 2) of the test cell 120, and some volume of the negative electrolyte may be pumped through the other electrolyte chamber 124 of the test cell 120. The volumes of positive and negative electrolytes pumped through the test cell 120 need not be equal. In some embodiments, the volumes of electrolytes pumped through the test cell 120 may be in excess of the volume of the respective half-cell compartments (electrolyte chambers 122, 124) so as to ensure that any excess liquid from previous tests is flushed out of the electrolyte chambers 122, 124.

In some embodiments, the electrolytes may then be discharged by short-circuiting the test cell 120, such as by electrically connecting the terminals 180, 182 of the two cell body halves 172, 174. In some embodiments, the test cell 120 may be connected to an electric load 114. The electrolytes in the electrolyte chambers 122, 124 may be discharged until eventually the test cell 120 reaches an open circuit voltage of approximately 0 V. At this point, the electrolytes in the two cell body halves 172, 174 of the test cell 120 will be chemically the same as they would be if the electrolytes had been directly mixed in equal volumes. In other words, after discharging the test cell 120, the electrolyte in both electrolyte chambers 122, 124 will have an SOO that is the average of the two individual electrolytes.

In some cases, allowing the test cell 120 to discharge by a short circuit may take an undesirably long time. Thus, in some embodiments, the test cell 120 may be discharged by applying a discharge current. In some embodiments, a discharge current may be applied by repeatedly passing short-duration electric current pulses through the test cell 120 while regularly checking open-circuit-voltage of the test cell 120 in between current pulses. The pulsed-current discharge process may continue until the voltage measurement indicates that the test cell 120 has been discharged substantially to zero (or near enough to zero or less than about 0.002V in some embodiments). In some embodiments, an applied current of about 0.2 A or higher may be used as a discharge current. In some embodiments, a higher current may discharge the electrolytes in the test cell 120 faster, but higher currents may also require faster electronics to monitor changes in cell voltage. In other embodiments, smaller discharge currents may be desirable. Thus, in some embodiments, the applied current may depend on the size of the test cell, among other factors.

Once both electrolyte chambers 122, 124 of the test cell 120 contain neutralized electrolyte, a charging current may be applied to the test cell. The change in cell voltage may then be monitored over time until the test cell OCV or CCV reaches a pre-determined value (or until another stop-point is reached). The total charging time between initiating a charging current and the test cell 120 reaching the pre-determined end-point may be correlated to the degree of imbalance as described in further detail below.

Embodiments of a coulometric imbalance measurement process for an Fe/Cr flow battery will now be described with reference to FIGS. 7A-7F. Although the following examples are given with reference to an Fe/Cr redox couple, the same principles will apply to substantially any other redox couple.

In the case of an Fe/Cr flow battery, the standard reduction potentials are:

$$e^- + Fe^{3+} \rightarrow Fe^{2+} \quad E°_{Fe} = 0.65V \quad [5]$$

$$Cr^{3+} \rightarrow Cr^{2+} + e^- \quad E°_{Cr} = -0.35V \quad [6]$$

The potential of each electrolyte may be determined from the Nernst equation as a function of the ratio of uncharged to charged concentration. For example:

$$\text{Catholyte: } E_{Fe} = E°_{Fe} + (RT/nF)Ln(Fe^{2+}/Fe^{3+}) \quad [7]$$

$$\text{Anolyte: } E_{Cr} = E°_{Cr} + (RT/nF)Ln(Cr^{2+}/Cr^{3+}) \quad [8]$$

For the special case of a perfectly discharged electrolyte, the entire concentration of the active species will be in their discharged forms. As a result, the second term of the Nernst equations becomes undefined. In most such cases, the potential of each electrolyte is about half the sum of the standard redox potentials:

$$E = (E°_{Fe} + E°_{Cr})/2 \quad [9]$$

Thus, by using equations [5]-[9], the theoretical potential at any state of oxidation may be calculated for a pair of flow battery electrolytes. The double-S shaped curve 200 of FIG. 7A-7C is a graph of electric potential vs. charged-species concentration difference (i.e. $Fe^{3+} = Cr^{2+}$) for an Fe/Cr redox couple. The examples of FIGS. 7A-7E assume that the total concentration of each active material is the same in both electrolytes (e.g., that total Fe=total Cr=1M). The corresponding graphs for embodiments with unequal total concentrates will be qualitatively similar, but the positive and negative plateaus will be of different widths.

The imbalance of the electrolytes may be defined in terms of concentration as the difference between the concentration of $Fe^{3+}$ in the positive electrolyte and that of $Cr^{2+}$ in the negative electrolyte. In a perfectly balanced system, the concentration of $Fe^{3+}$ in the positive electrolyte is equal to the concentration of $Cr^{2+}$ in the negative electrolyte, and the imbalance is zero. Thus, the horizontal axis of the charts in FIGS. 7A-7C may also be labeled "imbalance."

FIGS. 7A-D illustrate the theoretical relationship between electrolyte concentration difference ($Fe^{3+} - Cr^{2+}$) and electric potential (V) of the positive electrolyte (represented by positive values to the right of zero) and negative electrolyte (represented by negative values to the left of zero). If the electrolytes are balanced (and total Fe=total Cr), the concentration difference of the positive electrolyte will be equal in magnitude and opposite in sign to the concentration difference of the negative electrolyte.

When positive and negative electrolytes are neutralized (as described above), the catholyte concentration difference decreases (moves to the left) and the anolyte concentration difference increases (moves to the right), until the two concentration difference values meet at a point equal distance in x coordinate from the two original points. If the imbalance is zero, the final point is the midpoint of the double S curve 200, as indicated by the diamond 202 at the center of FIG. 7A. The diamond 202 also represents the midpoint between the starting SOO values of the anolyte and catholyte indicated by the squares 204, 206. The maximum slope of the double S curve 200 occurs at the point at which SOO=0.

As shown in FIG. 7B, when the imbalance is greater than zero (i.e. positive imbalance), the final point 210 after SOO-averaging the electrolytes is still an equal distance in x coordinates from the two original points 212, 214, but it is not the mid-point of the double S curve 200. As shown, the final point 210 for a neutral electrolyte of this positively unbalanced electrolyte is shifted to the right of zero on the double S curve 200. (If the electrolyte were negatively unbalanced by the same amount, the final point 210 would be shifted an equal distance to the left of zero on the curve 200). To test the degree of imbalance of this solution within a test cell 120, a charging current may be applied to the test cell 120. At this point, the solution in the positive chamber of the test cell 120 becomes representative of the catholyte, and the solution in the negative chamber of the test cell becomes representative of the anolyte.

As the test cell 120 is charged, the cell voltage (which is the difference between the positive electrolyte potential and the electrolyte negative potential) will increase as the positive electrolyte concentration difference moves to the right and the negative concentration difference moves to the left from the midpoint (final point 210) along the double S curve 200. As shown in FIG. 7C, as the test cell 120 is charged, the catholyte concentration difference increases from point P1 to point P2 to point P3, while the anolyte concentration difference decreases from point N1 to point N2 to point N3. As the concentration difference values move through these points, the test cell OCV will remain close to zero for a period of time, and will then rise sharply as the concentration difference of the negative electrolyte approaches zero. In some embodiments, this point (i.e. the point at which the concentration difference of the negative electrolyte is substantially equal to zero) is the point at which the time measurement should be stopped, since this is the point at which all the excess charged reactant species in the neutralized electrolyte has been converted (i.e., oxidized or reduced) to its discharged form (e.g., all $Fe^{3+}$ has been reduced to $Fe^{2+}$). Methods of identifying this end-point during measurement will be described in more detail below.

As shown in FIG. 7D, the slope of the OCV versus change in concentration difference curve 220 dramatically increases at about the point representing an excess $Fe^{3+}$ concentration of 0.2. The slope of the OCV versus time curve 230 will be similarly shaped in FIG. 7E, and will reach a maximum at the point that corresponds to one of the electrolyte concentration differences passing through zero in the double S curve 200 of FIGS. 7A-7C.

Figure 7F:
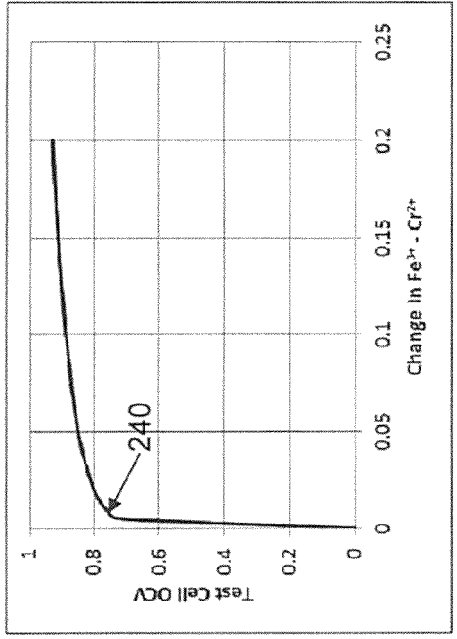
FIG. 7F is a graph of test cell OCV vs. change in concentration difference illustrating charging of a balanced electrolyte in a test cell.

By contrast, FIG. 7F illustrates an OCV versus change in concentration difference curve 240 for the balanced electrolyte of FIG. 7A. In this case, because the starting concentration difference is zero, the cell potential immediately increases dramatically before the slope decreases as the charged species concentrations depart from zero.

Figure 7E:
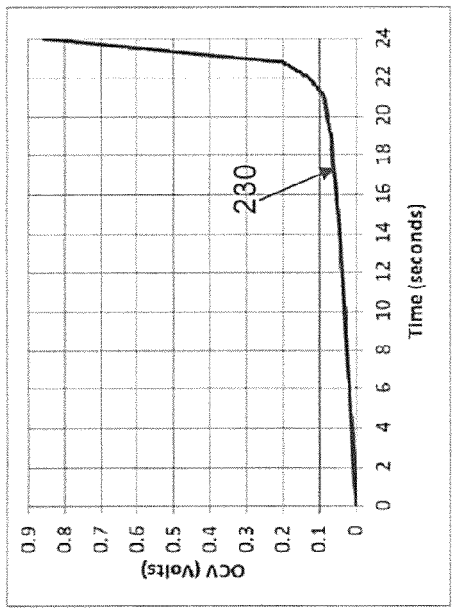
FIG. 7E is a graph of test cell OCV vs. time during charging of an unbalanced electrolyte in a test cell.
Figure 7G:
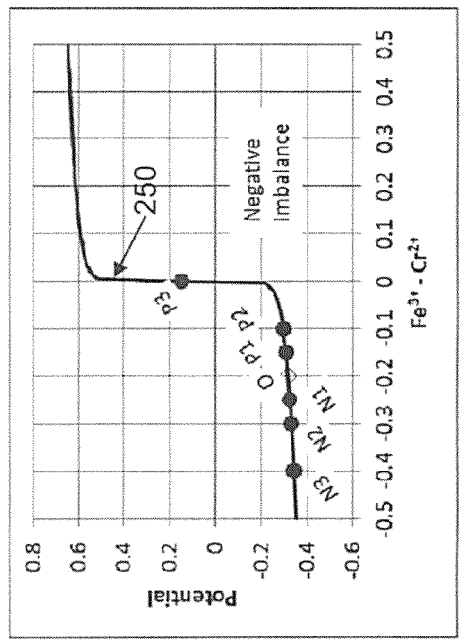
FIG. 7G is a graph of electrolyte potential vs. concentration difference for an Fe/Cr flow battery system, with points illustrating a negatively unbalanced electrolyte solution.

FIG. 7G is a graph 250 of electrolyte potential versus concentration difference for an Fe/Cr flow battery system, with points illustrating a negatively unbalanced electrolyte solution.

When a pre-determined end-point is reached, the charging may be stopped, and the total charge time may be determined. In some embodiments, the cell may be charged by alternately applying charge current pulses and switching off the charging current to measure OCV. For example, in some embodiments, a pulsed charging current may be cycled between applying a current for 0.4 second and switching off the current for 0.1 second. In such an example, a charging current is applied for eight tenths (80%) of each second. Thus, a total charge time may be obtained by multiplying a total elapsed time (i.e., the time between initiating a charge and reaching an end-point) by the proportion of time during which current is applied (i.e., 80% in the above example).

Charging the cell at a known current for a measured amount of time (t) in seconds, the cumulative quantity of charge (i.e., the number of Coulombs, 'C') introduced into the electrolytes may be calculated based on the definition of electric current (I):

$$C = t*I \qquad [10]$$

The number of moles ('M') of charged electrolyte species corresponding to the cumulative charge may be obtained by dividing the charge by the Faraday constant ('F'):

$$M = C/F \qquad [11]$$

This provides the number of moles of the excess charged electrolyte species in the neutralized electrolyte. Because the selected measurement end-point ideally represents the point at which the non-excess electrolyte concentration difference is zero, the number of moles calculated in equation [11] represents the number of moles of excess charged ions in the neutralized electrolyte. Dividing M by the known volume of one test cell chamber provides the molar concentration of the excess species in the neutralized electrolyte. The imbalance of the system is the difference between $Fe^{2+}$ in the catholyte and $Cr^{2+}$ in the anolyte. This is twice the amount of the excess species in the final neutralized electrolyte. Therefore the system imbalance is twice the molar concentration of the excess species.

Figure 8:
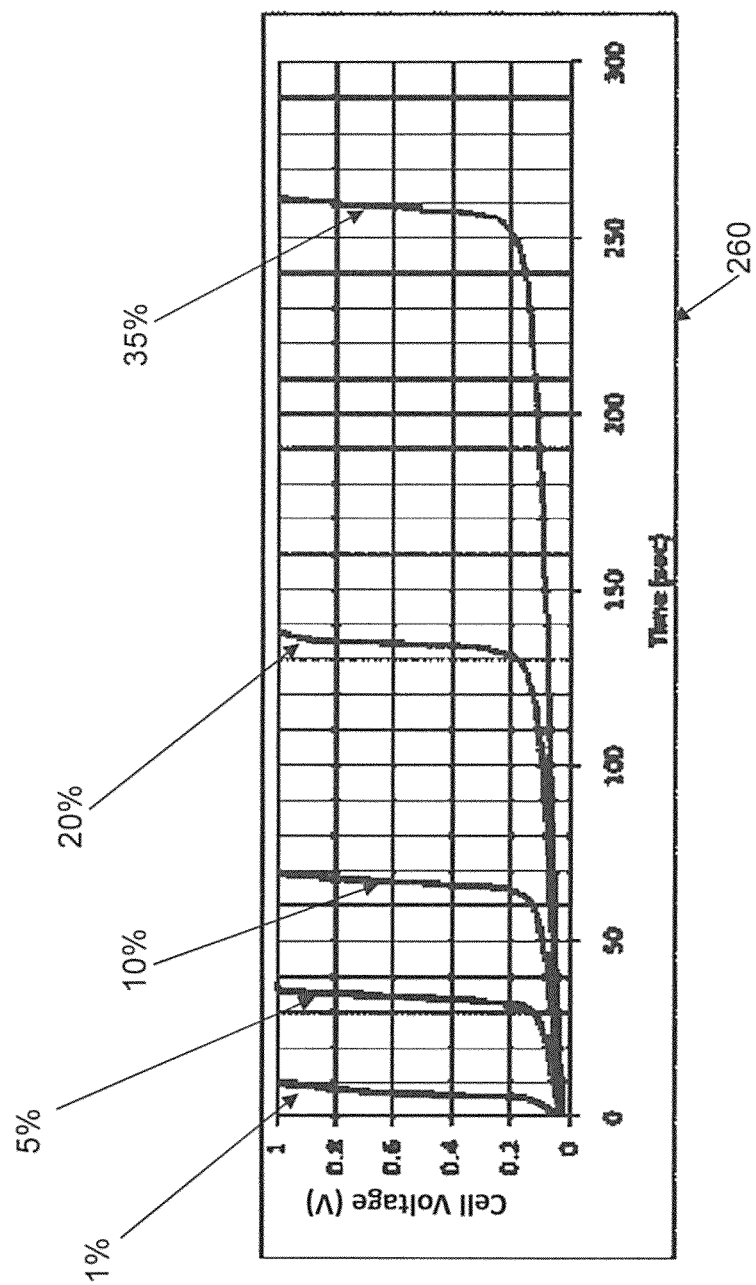
FIG. 8 is a graph of cell voltage vs. time illustrating charging of several samples of known imbalance.

FIG. 8 illustrates a graph 260 of several examples of test cell voltage versus time relationships using samples with known excess concentrations of $Fe^{3+}/Cr^{2+}$ in a prototype test cell. The voltage versus time and voltage versus SOO change relationships will vary depending on specific characteristics of the test cell, including the cell's electrical resistance, the volume of the electrolyte chambers, the type of separator membrane used, and other factors.

In some embodiments, a reference electrode may be useful in distinguishing positive imbalance in which $[Fe^{3+}] > [Cr^{2+}]$ from negative imbalance in which $[Cr^{2+}] > [Fe^{3+}]$. A practical reference electrode 300 as shown in FIGS. 9A-9B typically has its own internal solution, the concentration of which remains constant. This gives a constant potential of the reference electrode 300. The internal solution may be placed in contact with a sample electrolyte 302 through a junction made of a porous material, as shown for example in FIG. 9B.

Some reference electrodes may not be stable in long term contact with liquid electrolytes because the electrolyte being measured can leak into the reference electrode chamber and mix with the reference electrode's internal solution, thereby degrading the accuracy of the measurement. In some embodiments, a reference electrode for long-term use in a redox flow battery electrolyte may be constructed with features designed to limit the rate of migration of electrolyte liquid into the internal solution of the reference electrode. In general, such features may include a leak path that is relatively long and/or has a relatively small cross-sectional area. Additionally, well-sealed chambers may be further beneficial.

Figure 9C:
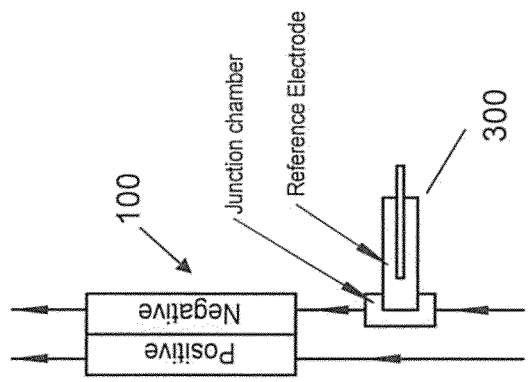
FIG. 9C is a schematic illustration of one embodiment of a reference electrode coupled to a junction in an electrolyte conduit.
Figure 9B:
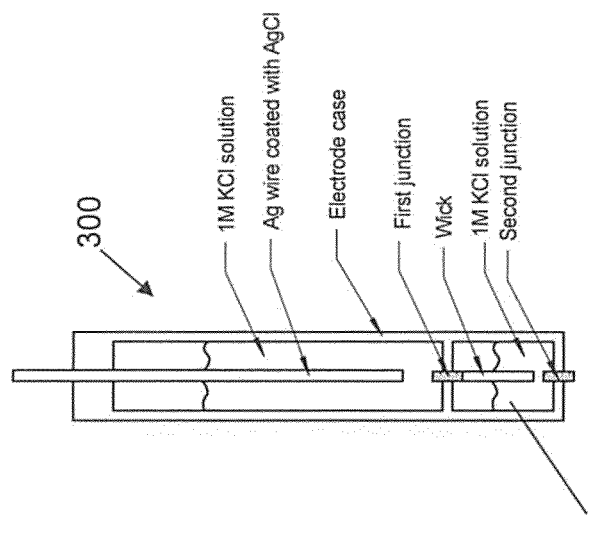
FIG. 9B is a schematic illustration of another embodiment of a reference electrode.
Figure 9A:
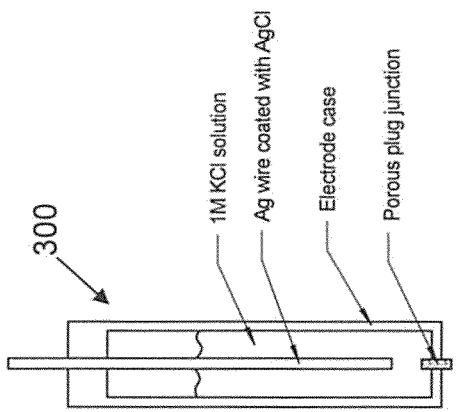
FIG. 9A is a schematic illustration of one embodiment of a reference electrode.

In FIG. 9C, a reference electrode 300 may be incorporated with an imbalance or electrolyte concentration monitoring system test cell 100 such as those described herein by placing the reference electrode in contact with at least one electrolyte somewhere in the flow path. In some embodiments, the point of contact does not need to be inside the imbalance test cell (although, it may be), and may be either in the flow path of the catholyte or the anolyte, either up-stream or down-stream from the cell.

In some embodiments, measurement of the potential of either the positive or the negative electrolyte may be made with respect to the reference electrode. The value of such a measurement may unambiguously determine whether the system has positive or negative imbalance. Although measurement with a reference electrode is not highly accurate, and may be subject to an uncertainty on the order of 10 mV, such uncertainty does not affect the use of the reference electrode for this purpose. This is because the cases of positive and negative imbalance give very different potential of the neutralized electrolyte. Because the middle section of the double S curve is very steep, a small difference in concentration corresponds to a large difference in OCV. For example, a positive imbalance of +0.005M and a negative imbalance of −0.005M results in about 0.7V difference in the potential.

With the internal solution of the reference electrode in contact with the test electrolyte through a porous junction, the chemical species in the test electrolyte will diffuse into the internal solution of the reference electrode over time, negatively affecting its accuracy. This may be greatly delayed by using reference electrode with multiple junctions, as shown in FIG. 9B. In some embodiments, a reference electrode with three or more junctions may also be used.

In various embodiments, the pre-determined end-point at which the time measurement is stopped may be based on different parameters. In some embodiments, the end point may be a voltage value may be based on a pre-determined value of either the closed circuit voltage (CCV) or open circuit voltage (OCV) of the cell. If CCV is used as the criterion, the charging current may be applied and CCV may be measured continuously. This may simplify the electronic module 198. If OCV is used as the criterion, the end point may be sharper and the accuracy may be improved, but the charging current must be applied in a pulsed manner such that OCV may be measured at regular intervals.

In some embodiments, a pre-determined end-point cell voltage (OCV or CCV) may be determined based on the known theoretical relationship between voltage and electrolyte concentration as shown and described above with reference to FIGS. 7A-7F. For example, as shown in FIG. 7D when change in $Fe^{3+}-Cr^{2+}$ is near 0.2 M, the test cell OCV changes sharply. This indicates that 0.2 M is the end point. In some embodiments, an end-point voltage may be at least 0.5 V. In some particular embodiments, an end-point voltage may be about 0.55 V, 0.65 V or about 0.7 V. In some embodiments, the ideal end-point voltage may change over time due to changing resistance of the test cell. Such changes may be identified by calibration and appropriate adjustments to end-point voltage or other adjustments may be made. Different end-point voltage values may be implied by voltage/concentration curves for different redox couples.

In other embodiments, a time measurement end-point may be based on a point at which the slope of the measured voltage vs. time curve reaches a maximum. For example, in some embodiments, measurement data (e.g., OCV and elapsed time) may be sampled and stored in a digital memory during a single test. Such measurement data may be analyzed by a processor to identify a maximum voltage vs. time slope. In some embodiments, the maximum slope may only be identifiable after it has passed. In such embodiments, the end-point time may be identified and applied retroactively.

In some embodiments, both a threshold voltage and a peak slope may be used to identify a measurement time end-point. For example, in some embodiments a processor may begin analyzing data to identify a maximum voltage vs. time slope only after a threshold voltage has been reached. In other embodiments, the calculation of a maximum slope may utilize other related quantities, such as voltage versus coulombs or others.

In some embodiments, a coulometric monitoring method may comprise the following operations: (1) Mix equal volumes (e.g. about 5 mL each in one embodiment) of positive and negative electrolyte; (2) Fill both chambers of the test cell with the neutralized electrolyte solution, flushing out any previously-present liquid from the test cell; (3) Apply a charging current to the test cell (e.g. about 0.2 A in one embodiment); and (4) Measure time until the voltage of the test cell reaches a desired set point (e.g. about 0.6 V in one embodiment). (5) Calculate a degree of electrolyte imbalance based on the coulombs of charge transferred to the electrolyte. Alternatively, Step (4) may comprise measuring time until the slope of a voltage versus time curve reaches a maximum or exceeds a pre-determined threshold.

In alternative embodiments, a coulometric monitoring method may comprise the following steps: (1) Fill each chamber of the test cell with a respective positive or negative electrolyte; (2) Discharge the test cell to approximately zero volts (e.g. by a short-circuit, by connecting a load, or by applying a pulsed discharge current); (3) Apply a charging current to the test cell (e.g. about 0.2 A in one embodiment); and (4) Measure time until the voltage of the test cell reaches a desired set point (e.g. about 0.6 V in one embodiment). (5) Calculate a degree of electrolyte imbalance based on the coulombs of charge transferred to the electrolyte. Alternatively, Step (4) may comprise measuring time until the slope of a voltage versus time curve reaches a maximum or exceeds a pre-determined threshold.

In some embodiments, the system may be calibrated using these steps with electrolytes of a known imbalance. For example, an electrolyte solution may be prepared with concentrations of total active materials identical to a flow battery system to be monitored. Such a solution may be prepared with a known excess quantity of one charged active species (e.g., with a known unbalanced ratio of $Fe^{3+}$ to $Cr^{2+}$). Alternatively, only one standard solution may be used to avoid difficulties in creating the neutralized electrolyte that is made by mixing two electrolytes and in keeping a $Cr^{2+}$ solution with an accurate concentration. By testing such a known imbalanced electrolyte in a test cell, the test cell may be calibrated by applying a calibration constant to correct any systematic error between an imbalance measured by the test cell and the known imbalance of the test sample.

Example of Imbalance Measurement Operation and Calculation

In FIG. 7E, a curve 230 of OCV as a function of time is depicted. The volume of an imbalance test cell is 0.8 mL on each side. When the cell is flushed with excess amount of electrolytes to be tested, 0.8 mL of each electrolyte (catholyte and anolyte) is retained in the cell. The cell is discharged until OCV is <0.002 V five (5) seconds after open circuit starts. Then the cell is charged with 0.2 A pulses. The pulse is turned for 0.4 seconds and turn off for 0.1 seconds. During the 0.1 second of open-circuit, the OCV is measured. Thus the current is turned on 80% of the time. This process of alternately charging and monitoring is then continued. When a time 24 seconds has elapsed, the OCV has reached 0.854 V and the charging is stopped. The curve of OCV versus time may be constructed on reviewing the data. The OCV versus time curve 230 for this example is shown in FIG. 7E.

The slope of the curve 230 is the steepest at time=23.5 s, which corresponds to the end point of the charging. During the 23.5 seconds, the current was on 80% of the time. Thus, the total charge time was:

$$23.5 \text{ seconds} \times 80\% = 18.8 \text{ seconds}.$$

Since the current was 0.2 A, the cumulative total charge is:

$$0.2 \text{ A} \times 18.8 \text{ s} = 3.76 \text{ Coulombs}$$

The number of moles corresponding to this is obtained by dividing the cumulative total charge by the Faraday constant:

$$3.76 \text{ C}/(96487 \text{ C/mol}) = 3.90\text{E}-5 \text{ moles}$$

Dividing by the volume of one electrolyte chamber of the test cell gives the concentration of $Fe^{3+}$ in the neutralized electrolyte (assuming the imbalance is known to be positive imbalance):

3.90E−5 moles/0.0008 L=0.0487 M

The imbalance of the system is the difference between $Fe^{3+}$ in the positive electrolyte and $Cr^{2+}$ in the negative electrolyte. This is twice the amount of $Fe^{2+}$ in the final neutralized electrolyte. Therefore the imbalance is:

0.049 M×2=0.0974 M.

The imbalance may also be expressed as a %, assuming the electrolyte is 1.3M in both Fe and Cr, then the % imbalance is:

0.0974 M/1.3 M=7.5%

Single Reactant Concentration Measurement Using a Reference Electrode

In some embodiments, the concentration of a single charged electrolyte reactant may be measured in a test cell. In some embodiments, such measurements may use a reference electrode measurement as described above. For example, using a reference electrode and a test cell, the concentrations of $Fe^{3+}$ and/or $Cr^{2+}$ may be determined individually. In some embodiments, anolyte and catholyte are not pre-mixed before filling the cell. In other words, the positive and negative electrolyte chambers of the test cell should be filled with catholyte and anolyte individually, then discharged at a known (e.g., measured or controlled) current to substantially near zero OCV. The individual concentrations of $Fe^{3+}$ and $Cr^{2+}$ may be determined from the curve of OCV vs. change in charged electrolyte concentrations (e.g., change in $Fe^{3+}$–$Cr^{2+}$) while discharging the separate electrolytes in the test cell. Thus, although current during discharge of the test cell does not need to be known when only measuring imbalance, by monitoring or controlling the current during discharge of the test cell, the concentrations of $Fe^{3+}$ and $Cr^{2+}$ may be measured with minimal additional effort. In any case, the discharge current need not be constant.

FIGS. 10A and 10B illustrate an example of graphical results 400 and 402, respectively, such a process for a system with positive imbalance. The original catholyte and anolyte in respective chambers of a test cell are represented by points P0 and N0. While discharging the test cell, the two electrolytes move toward each other along the double S curve 404. The positive electrolyte moves progressively along the curve 404 from point P0 to P1, P2, P3 and P4, and at the same time the negative electrolyte moves along the curve from point N0 to N1, N2, N3 and N4 in that order. The horizontal dashed line represents the potential measured by an Ag/AgCl reference electrode.

Using a reference electrode and the test cell OCV, the potentials of the positive and the negative electrolytes in the positive and negative test cell halves may be measured throughout the discharge process. From FIGS. 10A and 10B, it may be seen that the potential of the positive half-cell changes little from P0 to P4. By contrast, the potential of the negative half-cell changes little from N0 to N2, but rises sharply at N3. FIG. 10B illustrates a chart of potential (i.e., half-cell potentials relative to the reference potential) vs. change in charged reactant concentration (e.g., $Fe^{3+}$–$Cr^{2+}$). As will be clear in view of the above discussion, the x-axis of FIG. 10B is directly related to discharge time when discharging of the test cell proceeds at a known current.

In contrast to the above embodiments of imbalance measurements by coulometric titration, the methods of the present embodiments may measure the concentrations of both charged electrolyte species (e.g., $Fe^{3+}$ and $Cr^{2+}$) in a single test cell discharge/charge process in addition to measuring the imbalance. As described above, if only imbalance is to be measured, the test cell may be discharged to substantially 0V to obtain a starting point. In such cases, coulombs need not be counted during the discharge phase. The electrolytes may be physically mixed to obtain the same result as discharging, which would also preclude counting coulombs. By contrast, single reactant concentration measurements may involve measuring two out of three related quantities (i.e., the concentration of each charged species and the imbalance).

For instance, in a positively imbalanced pair of electrolytes, $Cr^{2+}$ concentration and the imbalance may be measured, from which the concentration of $Fe^{3+}$ may be calculated. In some embodiments in which coulombs are counted during discharge, the discharge stage may have two end points. For example, a first discharge end point may be the point at which a sudden jump in the measured potential of the negative half-cell versus the reference potential occurs. The second discharge end point may be the point at which the cell OCV is substantially zero (similar to the embodiments of imbalance-only measurements described above). Coulombs may be measured between a starting point and the first end point to calculate $Cr^{2+}$ concentration. However, coulombs need not be measured for the second discharge phase between the first end point and the second end point. From that point, the test cell may be charged, and coulombs may be measured during charging to calculate imbalance as described above with reference to embodiments of imbalance measurement methods.

In FIG. 10B, the potential of the negative half of the cell (filled with anolyte) rises sharply at X=0.3. Up to this point, the potential of the positive half of the cell (filled with catholyte) has changed little. This suggests that there is more $Fe^{3+}$ than $Cr^{2+}$ in the system, and that the $Cr^{2+}$ concentration in the original anolyte is 0.3 M. The discharge continues until OCV reaches nearly zero. At this point the electrolytes are essentially neutralized. The imbalance in the electrolytes (e.g., $Fe^{3+}$–$Cr^{2+}$) may be determined by any of the imbalance measurement embodiments described above using the neutralized electrolyte in the same test cell. Once the concentration of the anolyte reactant (e.g., $Cr^{2+}$) is known and the imbalance is known, the $Fe^{3+}$ concentration may be calculated from $Fe^{3+}$=imbalance+$Cr^{2+}$.

FIGS. 10C-10D illustrate an example with graphical results 420, 422, respectively, of a similar process for a system with negative imbalance. In FIG. 10C, the original catholyte and anolyte are represented by points P0 and N0, respectively. As the test cell is discharged, the two electrolytes move toward each other along the curve 404. The positive electrolyte moves progressively from point P0 to P1, P2, P3 and P4, and at the same time the negative electrolyte moves progressively from point N0 to N1, N2, N3 and N4. The horizontal dashed line represents the potential measured by the reference electrode.

Using a reference electrode and the test cell OCV, the potentials of the positive and the negative half of the test cell may be measured throughout the discharge process. From FIGS. 10C and 10D, it may be seen that the potential of the negative half-cell changes little from N0 to N4, while the potential of the positive half-cell changes little from P0 to P2, but drops sharply at point P3. FIG. 10D illustrates a chart of the potential (i.e., half-cell potentials relative to the reference potential) vs. change in charged reactant concentration (e.g., $Fe^{3+}$–$Cr^{2+}$) As will be clear in view of the above discussion, the x-axis of FIG. 10D is directly related to discharge time when discharging of the test cell proceeds at a known controlled current.

In FIG. 10D, the potential of positive half of the cell (filled with catholyte) drops sharply at X=0.3. Up to this point, the potential of the negative half of the cell (filled with anolyte) has changed little. This suggests that there is more $Cr^{2+}$ than $Fe^{3+}$ in the system, and that the $Fe^{3+}$ concentration in the original catholyte is 0.3 M. The discharge continues until OCV reaches nearly zero. At this point the electrolytes are essentially neutralized. The imbalance in the electrolytes (e.g., $Fe^{3+}-Cr^{2+}$) may be determined by any of the imbalance measurement embodiments described above using the now-neutralized electrolyte in the same test cell. Once the concentration of the catholyte reactant (e.g., $Fe^{3+}$) is known and the imbalance is known, the $Cr^{2+}$ concentration may be calculated from $Cr^{2+}=F^{3+}-$imbalance.

Single Reactant Concentration Measurement without a Reference Electrode

In some embodiments, the concentration of a single electrolyte reactant may be measured without the use of a reference electrode by placing only that electrolyte into both electrolyte chambers of a test cell. For example, the concentration of $Fe^{3+}$ in the catholyte may be measured by placing only the catholyte (without anolyte) in a test cell. Alternately, the concentration of $Cr^{2+}$ in the anolyte may be measured by placing only the anolyte (without catholyte) in the test cell.

Figure 11B:
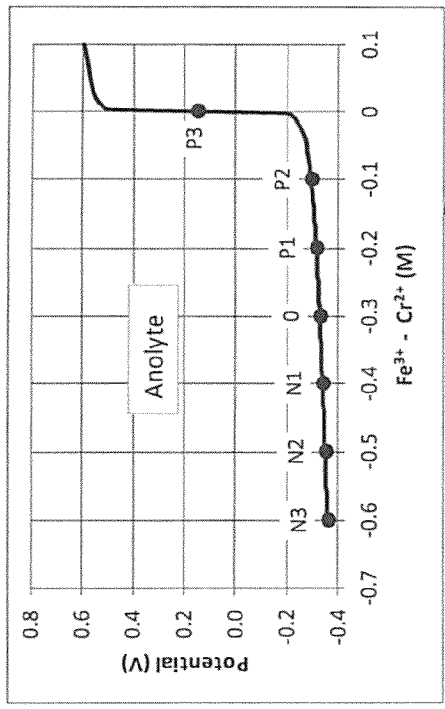
FIG. 11B is a graph illustrating a section of an electrolyte potential vs. concentration difference curve for an Fe/Cr flow battery system, with points illustrating a process for measuring a reactant concentration without a reference electrode.
Figure 11D:
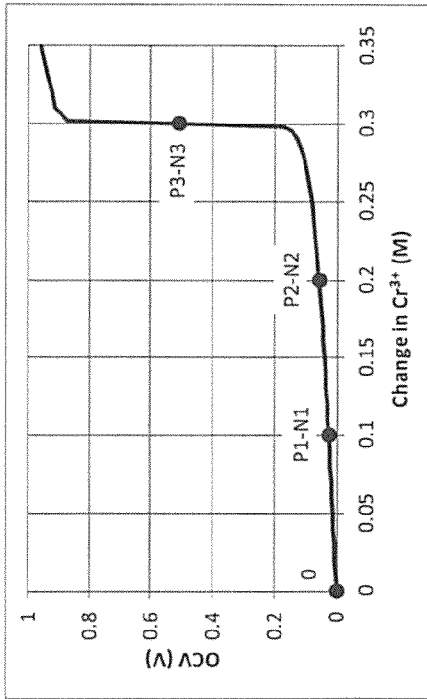
FIG. 11D is a graph illustrating change in test cell OCV versus change in reactant concentration for the process of FIG. 11B.
Figure 11A:
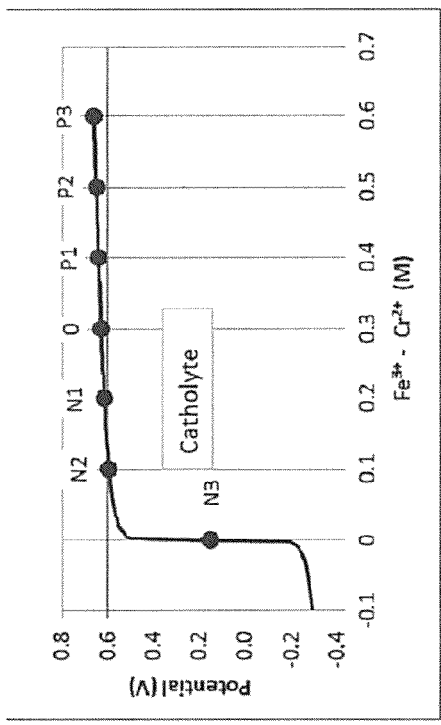
FIG. 11A is a graph illustrating a section of an electrolyte potential vs. concentration difference curve for an Fe/Cr flow battery system, with points illustrating a process for measuring a reactant concentration without a reference electrode.

FIG. 11A illustrates a graph 500 mainly the catholyte half of the double S curve for an Fe/Cr redox couple. A catholyte with $Fe^{3+}$ concentration=0.3M is represented by point 0. Both electrolyte chambers of a test cell may be filled with this catholyte. Since the same electrolyte is in both sides, the OCV is initially zero. The cell may then be charged with a controlled current while the OCV is measured vs. time. The time value may be converted to an equivalent concentration of $Fe^{3+}$ using the equations described above. During charging, electrolyte on the positive side of the test cell progressively passes through points P1, P2 and P3 while the electrolyte in the negative side progresses through points N1, N2, and N3.

Figure 11C:
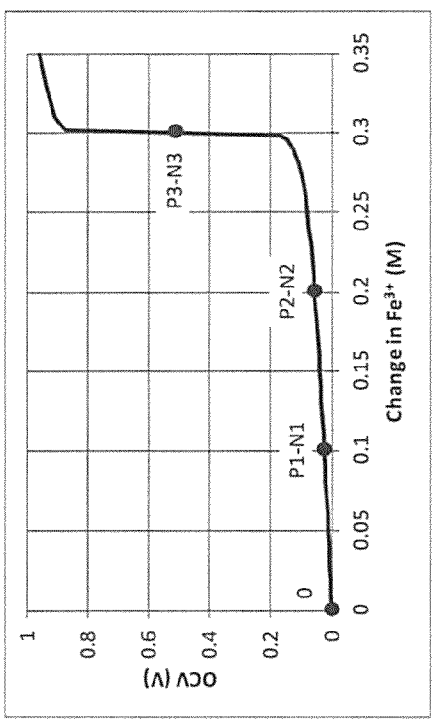
FIG. 11C is a graph illustrating change in test cell OCV versus change in reactant concentration for the process of FIG. 11A.

The measured OCV represents the difference between the potentials of the positive and the negative halves of the cell. FIG. 11C illustrates a graph 502 of the OCV vs. the concentration change (i.e., the change in $Fe^{3+}$ from the start of the test at point 0). A sharp rise in the OCV is observed at a concentration difference of $Fe^{3+}=0.3$. This indicates that the concentration of $Fe^{3+}$ in the original catholyte is 0.3M.

FIG. 11B and FIG. 11D illustrate graphs 504, 506, respectively, a similar embodiment for measuring the concentration of $Cr^{2+}$ in the anolyte. FIG. 11B illustrates mainly the anolyte half of the double S curve. An anolyte with $Cr^{2+}$ concentration=0.3M is represented by point 0. Both electrolyte chambers of a test cell may be filled with this anolyte. Since the same electrolyte is in both cell compartments, the OCV is zero. The cell may then be charged with a controlled current while the OCV is measured vs. time. The time value may be converted to an equivalent concentration of $Cr^{2+}$ using the equations above. During charging, the electrolyte in the positive side of the test cell progressively passes through points P1, P2 and P3 in that order while the electrolyte in the negative side progresses through points N1, N2, N3.

The measured OCV is the difference between the potentials of the positive and the negative half of the cell. FIG. 11D illustrates 506 a graph of OCV vs. the change in $Cr^{2+}$ (i.e. the change in concentration difference from the start of the test at point 0). A sharp rise in the OCV is observed at change in $Cr^{2+}=0.3$. This indicates that the concentration of $Cr^{2+}$ in the original anolyte is 0.3M.

The above examples illustrate measurement of the concentration of a reactant (e.g., $Fe^{3+}$) in catholyte using only catholyte, and measurement of the concentration of a reactant (e.g., $Cr^{2+}$) in the anolyte using only anolyte in the test cell. In either case, no reference is needed. The imbalance of the two electrolytes may then be obtained as the difference between the redox reactant (i.e., $Fe^{3+}-Cr^{2+}$).

However, in the measurement of individual concentrations without the use of a reference electrode, there are two limitations. The identity of the electrolyte being tested must be known independent of the test. A catholyte with $Fe^{3+}=0.3M$ cannot be distinguished from an anolyte with $Cr^{2+}=0.3M$. As a result, the curve in FIG. 11B is very similar to that in FIG. 11D.

The SOO of the catholyte or the anolyte should be less than about 0.4 to use this method. Otherwise the measured OCV curve may give a false result that folds over around SOO=0.5. This means that if the total Fe concentration is 1.0, then a catholyte with $Fe^{3+}=0.7$ is indistinguishable from that with $Fe^{3+}=0.3$; 0.8 is indistinguishable from 0.2, etc. The same applies to the anolyte.

Examples of Control Processes

Figures 12A, 12B:
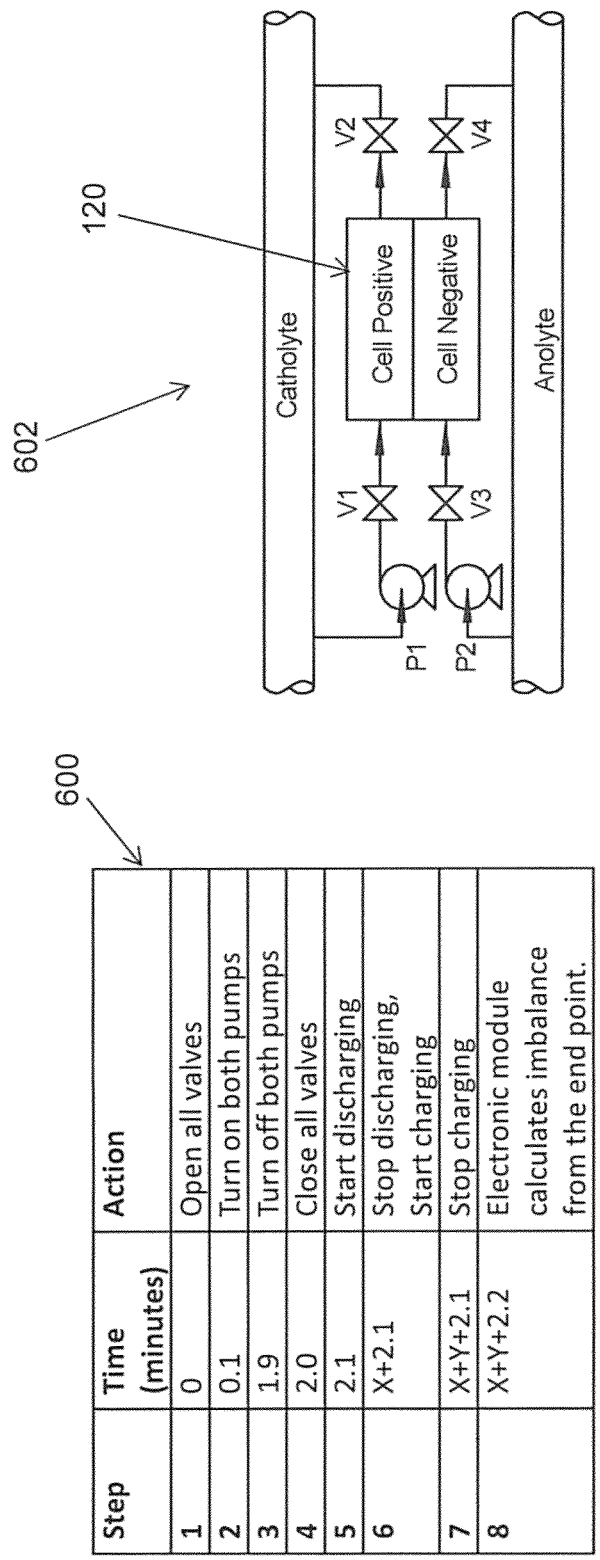
FIG. 12A is a process flow table illustrating a control process for measuring a degree of imbalance in a pair of flow battery electrolytes.
FIG. 12B is a schematic illustration of an embodiment of a fluid delivery system that may be used with the process of FIG. 12A

FIGS. 12A-14B provide examples of control process embodiments that may be controlled by an electronic module 198 as described above with reference to FIG. 1. The numeric time values provided in FIGS. 12A, 13A and 14A are provided primarily for reference and simplicity of explanation. Actual times may vary substantially from these values and may depend on many factors such as the time response of various system components.

FIG. 12A is a process flow diagram 600 illustrating an embodiment of a control process that may be executed by an electronic module 198 to control an imbalance measurement process using an electrolyte monitoring system with a through-flow fluid delivery system 602 as illustrated for example in FIG. 12B. The process s of FIG. 12A comprises the steps numbered 1-8, which may occur at the approximate times in the second column.

At the start of the measurement process of FIG. 12A, all valves V1, V2, V3 and V4 are all opened in step 1 at time t=0. Step two may begin once all valves are open, which may be at about time t=0.1 minutes. During step two, both pumps P1 and P2 may be started to pump electrolyte through the cell 120. Step two may proceed for a sufficient time and at a sufficient pump flow rate to flush out all electrolyte previously in the test cell 120 and in all tubing of the fluid delivery system 602. Once the test cell 120 is full of fresh electrolytes, the pumps may be shut off at step 3 which may be at a time of about t=1.9 minutes, and the valves may be closed (step 4) at t=2 minutes.

The test cell may then be discharged in a discharge process (step 5) that may begin at about time t=2.1 minutes. The discharge process (step 5) may continue until a desired near-zero OCV is reached, e.g. about 0.002 V in some embodiments. The time interval needed to discharge the test cell to the desired near-zero point will be variable and is therefore represented in FIG. 12A by the variable 'X'. The variable discharge time 'X' may depend on the value of the desired near-zero OCV, the value of an applied current, the degree of electrolyte imbalance, the SOO of the respective electrolytes, and other factors. As discussed above, some of these variable factors may be known, and in some embodiments the variable discharge time ('X') may be measured and evaluated to determine a reactant concentration. In some embodiments, the timer interval X may be a few seconds up to about three (3) minutes. In some embodiments, the discharge process may be stopped and a charging process may be started (step 6) at a time of about t=X+2.1. As discussed above, the time interval for the charging process (step 6) will also be variable, and may proceed until a desired measurement end-point is reached. The variable test cell charge time is represented as 'Y' in FIG. 12A. Thus, the charging process may be stopped at time t=X+Y+2.1 minutes. In some embodiments, Y may be a few seconds up to about 4 minutes or more.

Once the time interval Y is determined at the completion of step 7, the electronic module 198 may calculate the imbalance from the value of the time interval Y and other known system variables and constants as described above. In some embodiments, the electronic module may then communicate a measured imbalance value back to the main flow battery control system.

Figures 13A, 13B:
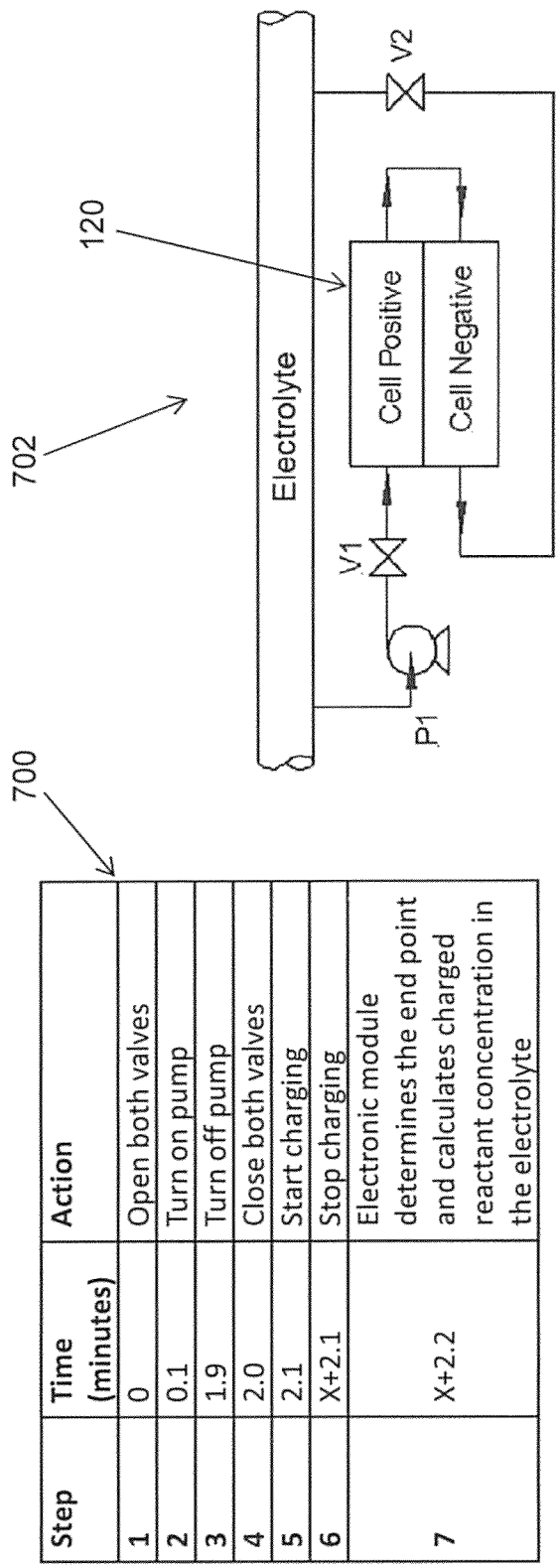
FIG. 13A is a process flow table illustrating a control process for measuring a concentration of a charged electrolyte reactant in a flow battery electrolyte.
FIG. 13B is a schematic illustration of an embodiment of a fluid delivery system that may be used with the process of FIG. 13A

FIG. 13A is a process flow diagram 700 illustrating an embodiment of a control process that may be executed by an electronic module 198 to control an electrolyte reactant concentration measurement process using an electrolyte monitoring system with a through-flow fluid delivery system 702 configured to direct only one electrolyte through the test cell 120 as illustrated for example in FIG. 13B. The process of FIG. 13A will now be described with reference to the catholyte of an Fe/Cr flow battery electrolyte. In some embodiments, the same process may be performed to make a corresponding measurement of the concentration of a charged reactant concentration in an anolyte. In some embodiments, the catholyte concentration measurement process and the anolyte concentration measurement process may be performed simultaneously in separate test cells, which may be located adjacent respective electrolyte storage tanks in some embodiments.

The process of FIG. 13A may begin at time t=0 by opening both valves V1 and V2. At time t=0.1 minutes, the pump P1 may be turned on (step 2), and catholyte may be pumped through the test cell 120 for a sufficient time and at a sufficient flow rate to flush out all electrolyte previously in the test cell and all tubing of the fluid delivery system 702. In some embodiments, the pumps may be stopped (step 3) at about time t=1.9 minutes, and both valves V1 and V2 may be closed (step 4) at about time t=2.0 minutes. Once filled with a single electrolyte, the test cell 120 may have an OCV of zero. The test cell 120 may be charged (step 5) beginning at time t=2.1 minutes. The test cell 120 may be charged until a desired end-point is reached as described above. As the test cell 120 is charged, the test cell OCV will increase from zero and the rate of OCV change will eventually reach a maximum before slowing down again. In some embodiments, the end-point may be the point at which the rate of OCV change versus time reaches a maximum before slowing down again. The charging time interval variable is represented by 'X' in FIG. 13A. Charging may be stopped (step 6) once the end-point is reached at time t=X+2.1. The electronic module may then calculate the charged electrolyte concentration (e.g., $Fe^{3+}$), and may communicate the measured concentration value to the main flow battery control system.

Figures 14A, 14B:
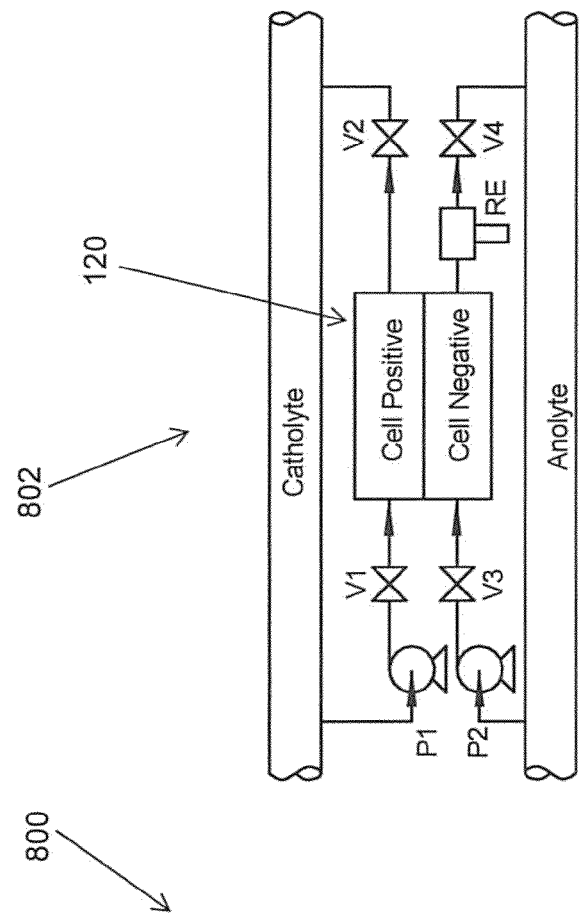
FIG. 14A is a process flow table illustrating a control process for measuring both a concentration of a charged electrolyte reactant in at least one electrolyte and a degree of imbalance in a pair of flow battery electrolytes.
FIG. 14B is a schematic illustration of an embodiment of a fluid delivery system that may be used with the process of FIG. 14A

FIG. 14A is a process flow diagram 800 illustrating an embodiment of a control process that may be executed by an electronic module to control an electrolyte reactant concentration measurement process and an imbalance measurement using an electrolyte monitoring system with a through-flow fluid delivery system 802, a reference electrode 'RE', and a test cell 120 as illustrated for example in FIG. 14B.

At the start of the measurement process of FIG. 14A, all valves V1, V2, V3 and V4 are all opened in step 1 at time t=0. Step two may begin once all valves are open, which may be at about time t=0.1 minutes. During step two, both pumps P1 and P2 may be started to pump electrolyte through the cell 120. Step two may proceed for a sufficient time and at a sufficient pump flow rate to flush out all electrolyte previously in the test cell 120 and in all tubing of the fluid delivery system 802. Once the test cell 120 is full of fresh electrolytes, the pumps may be shut off at step 3 which may be at a time of about t=1.9 minutes, and the valves may be closed (step 4) at about t=2 minutes.

The test cell 120 may then be discharged in a discharge process (step 5) that may begin at about time t=2.1 minutes. The discharge process (step 5) may continue until a predetermined end-point. The time interval needed to discharge the test cell to the desired end-point will be variable and is therefore represented in FIG. 14A by the variable 'X'. The end-point at which the discharging process is stopped (step 6) may be based on the rate of change of half-cell potential relative to the reference electrode. For example, if the electrolytes are known to have a negative imbalance (as determined by a reference electrode measurement as described above), the discharging end point may be the point at which the rate of change of the positive half-cell versus the reference electrode potential reaches a maximum before slowing down again. Alternatively, if the electrolytes are known to have a positive imbalance (as determined by a reference electrode measurement as described above), the discharging end-point may be the point at which the rate of change of the negative half-cell versus the reference electrode potential reaches a maximum before slowing down again. In other words, the measurement end-point may be the point at which dV/dt is a maximum (where V is potential, and t is time).

The electronic module may then determine the value of the elapsed discharge time (X), and may calculate the concentration of the indicated electrolyte. For example, the indicated electrolyte species may be $Fe^{3+}$ if the end point is reached on the positive side, or may be $Cr^{2+}$ if the end point is reached on the negative side. In some embodiments, the electronic module may then communicate the measured concentration value to the main flow battery control system in step 7 at about time t=X+2.2.

The test cell 120 may then be fully discharged to a near-zero point (step 8 at about time t=X+2.3 minutes) as described above with reference to the process of FIG. 12A. The discharge process may be stopped when the test cell OCV reaches a desired near-zero point (e.g., about 0.002 V in some embodiments), which may take a few seconds up to about 2 minutes, depending on several factors. The time interval for the second discharge stage may also be variable and is represented as 'Y' in FIG. 14A. Once the near-zero point is reached, charging of the test cell 120 may begin (step 9). The test cell 120 may be charged until a desired imbalance measurement end-point is reached as discussed above. The charging time interval is represented in FIG. 14A as 'Z'. Thus, the charging process may be stopped (step 10) at time X+Y+Z+2.3 minutes. The electronic module may then calculate the degree of electrolyte imbalance (step 11) and communicate the result to the main flow battery control system.

Chrono-Potentiometry Methods

In alternative embodiments, the degree of cell imbalance may be monitored using chrono-potentiometry without reference electrodes. In some embodiments of this method, the electrolytes may be pumped into a test cell (e.g. a cell such as those described above with reference to FIGS. 1-2). In some embodiments, a volume of positive electrolyte may be pumped into a positive side of the test cell and an approximately equal volume of negative electrolyte may be pumped into a negative side of the test cell.

Once the test cell is full of electrolyte, the electrolyte flow may be shut off. The cell may be held at open circuit while the open-circuit voltage (OCV) is recorded over a period of time. As the active species ions diffuse across the separator, the OCV will decrease over time. The imbalance may then be determined from the shape of the OCV-time curve. The total time for a measurable degree of change in OCV is significantly affected by the volume of electrolytes in the test cell. Thus, in some embodiments, the test cell may be made small enough that the OCV-time curve may cover a significant voltage range (e.g., 0.9 to 0.6 V) within a short time (e.g. on the order of minutes).

At any moment, including during open circuit, the $Fe^{3+}$ in the catholyte diffuses through the separator to the anolyte and reacts with $Cr^{2+}$. The $Cr^{2+}$ in the anolyte diffuses to the catholyte and reacts with $Fe^{3+}$. In either case, the reaction is:

$$Fe^{3+}+Cr^{2+} \rightarrow Fe^{2+}+Cr^{3+} \quad [14]$$

The rate of decrease in either $Fe^{3+}$ or $Cr^{2+}$ concentration is proportional to the sum of the two concentrations. This is described by a set of differential equations:

$$dFe^{3+}/dt = -k(Fe^{3+}+Cr^{2+}) \quad [15]$$

$$dCr^{2+}/dt = -k(Fe^{3+}+Cr^{2+}) \quad [16]$$

where 'k' is a rate constant and 't' is time. The magnitude of K may be obtained experimentally, and is mainly dependent on properties of the separator and the operating temperature. For example, K is larger for a more permeable separator.

Figure 15:
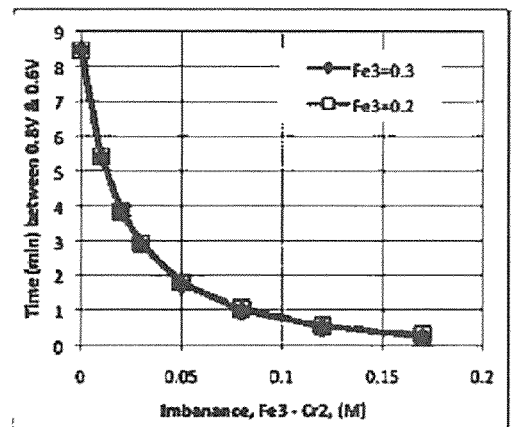
FIG. 15 is a graph of time vs. imbalance for Fe/Cr flow battery electrolytes.

When the value of K, and the initial concentrations of $Fe^{3+}$ and $Cr^{2+}$ are known, equations [7] and [8] may be solved numerically to give the concentrations of $Fe^{3+}$ and $Cr^{2+}$ as functions of time. The OCV of the cell may then be calculated from the Nernst equation. Practically, these values are not easily known, but the OCV of the cell at different time may be obtained from measurement. The above model may then be fitted to data of measured OCV vs. time. The initial concentrations of $Fe^{3+}$ and $Cr^{2+}$ and the value of K may be determined from the fitting. A graphical example 900 of such fitting is shown in FIG. 15.

Figure 17:
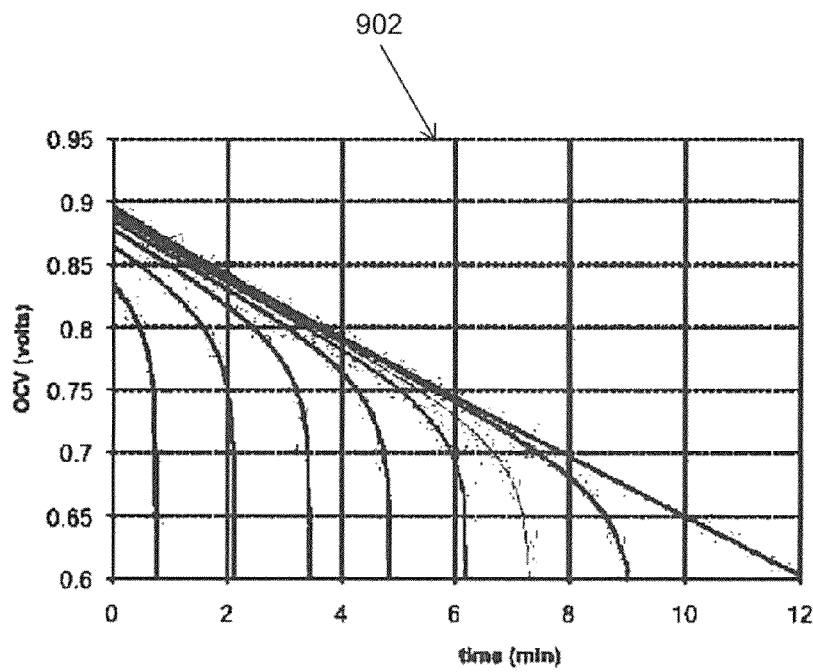
FIG. 17 is a graph of OCV vs. time illustrating several empirically-determined curves for samples of known imbalance.

FIG. 17 illustrates a graph 902 of an embodiment of an experimentally-determined relationship between cell OCV and time for various concentrations of electrolyte active materials for a particular cell arrangement. It has been found that the experimental data closely agrees with the mathematical model.

Figure 16:
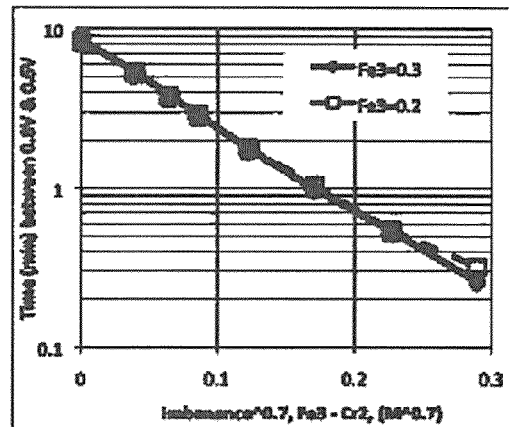
FIG. 16 is a linearized graph of time vs. imbalance for Fe/Cr flow battery electrolytes.

Thus, in some embodiments, this model may be used as a response for determining the extent of imbalance. For example, in some embodiments, the electrolyte concentration may be determined by measuring the time between two known voltages along the curve and matching the results to the model. For example, measuring the time between the test cell voltage reaching 0.8V and 0.6V may provide a consistently usable response because it is independent of the starting SOC. Such a relationship is shown in FIG. 15. In one embodiment, a plot of log(time) vs. imbalance raised to the 0.7th power is quite useful because it is linear, as shown in graph 904 in FIG. 16.

Density Measurement Embodiment

In other embodiments, electrolyte concentration, SOO and/or SOC may be monitored by measuring the density of one or both electrolytes. In some embodiments, a mixed reactant system for the fully discharged state may be: [A] 1M $FeCl_2$/1M $CrCl_3$/2M HCl, density 1.31585 g/cm3 (calculated); and [A] 2M $FeCl_2$/1M $CrCl_3$/3M HCl.

The discharged reactions are:

negative electrode: $Cr^{2+} \rightarrow Cr^{3+}+e^-$ [12]

positive electrode: $Fe^{3+} \rightarrow Fe^{2+}+e^-$ [13]

The charge reactions are the opposite of those given in Equations [2] and [3]. During charge and discharge, the valence state of Fe and Cr ions changes. To maintain electrical neutrality, various ions migrate across the separator. During charge, cations move from catholyte and anolyte, and anions move from anolyte to catholyte. During discharge, the opposite occurs. Therefore, the densities of both electrolytes change with SOO. The relationship between SOO and density may be very complex, but may be determined empirically.

Consider the change in density as a function of SOC for mixed reactant concentrations [A] and [B]. With [A], a change in SOC from 0% (fully discharged) to 100% (fully charged) yields a calculated density change of 0.000355 g/cm3 and 0.00071 g/cm3 with [B].

These changes in density may be measured with any density-measurement instrument. Such instruments are commercially available, for example from Anton-Paar, GMBH (http://www.anton-paar.com/) (US Office is at 10215 Timber Ridge Drive Ashland, Va. 23005), using the specifications in Table 1 below.

TABLE 1

| Density Sensors | | | |
|---|---|---|---|
| Instrument | Repeatability | Measuring Range | Temperature Range |
| DMA 4100 | 0.00005 g/cm³ | 0 to 3 g/cm³ | 0 to 90° C. |
| DMA 4500 | 0.00001 g/cm³ | | |
| DMA 5000 | 0.000001 g/cm³ | | |
| RXA 156 | 0.000002 nD | 1.32 to 1.56 nD | 10 to 70° C. |
| RXA 170 | 0.000004 nD | 1.30 to 1.70 nD | |

The examples, equations and methods for quantifying and monitoring electrolyte imbalances above are described with reference to an Fe/Cr flow battery chemistry. However the same principles and concepts may be applied to any flow battery chemistry without departing from the spirit of the invention.

Embodiments of redox flow battery cells, stack assemblies and systems described herein may be used with any electrochemical reactant combinations that include reactants dissolved in an electrolyte. One example is a stack assembly containing the vanadium reactants V(II)/V(III) or $V^{2+}/V^{3+}$ at the negative electrode (anolyte) and V(IV)/V(V) or $V^{4+}/V^{5+}$ at the positive electrode (catholyte). The anolyte and catholyte reactants in such a system are dissolved in sulfuric acid. This type of battery is often called the all-vanadium battery because both the anolyte and catholyte contain vanadium species. Other combinations of reactants in a flow battery that may utilize the features and advantages of the systems described herein include Sn (anolyte)/Fe (catholyte), Mn (anolyte)/Fe (catholyte), V (anolyte)/Fe (catholyte), V (anolyte)/Ce (catholyte), V (anolyte)/$Br_2$ (catholyte), Fe (anolyte)/$Br_2$ (catholyte), and S (anolyte)/$Br_2$ (catholyte). In each of these example chemistries, the reactants are present as dissolved ionic species in the electrolytes, which permits the advantageous use of configured cascade flow battery cell and stack assembly designs in which cells have different physical, chemical or electrochemical properties along the cascade flow path (e.g. cell size, type of membrane or separator, type and amount of catalyst, etc.). A further example of a workable redox flow battery chemistry and system is provided in U.S. Pat. No. 6,475,661, the entire contents of which are incorporated herein by reference. Many of the embodiments herein may be applied to so-called "hybrid" flow batteries (such as a zinc/bromine battery system) which use only a single flowing electrolyte.

Figure 18:
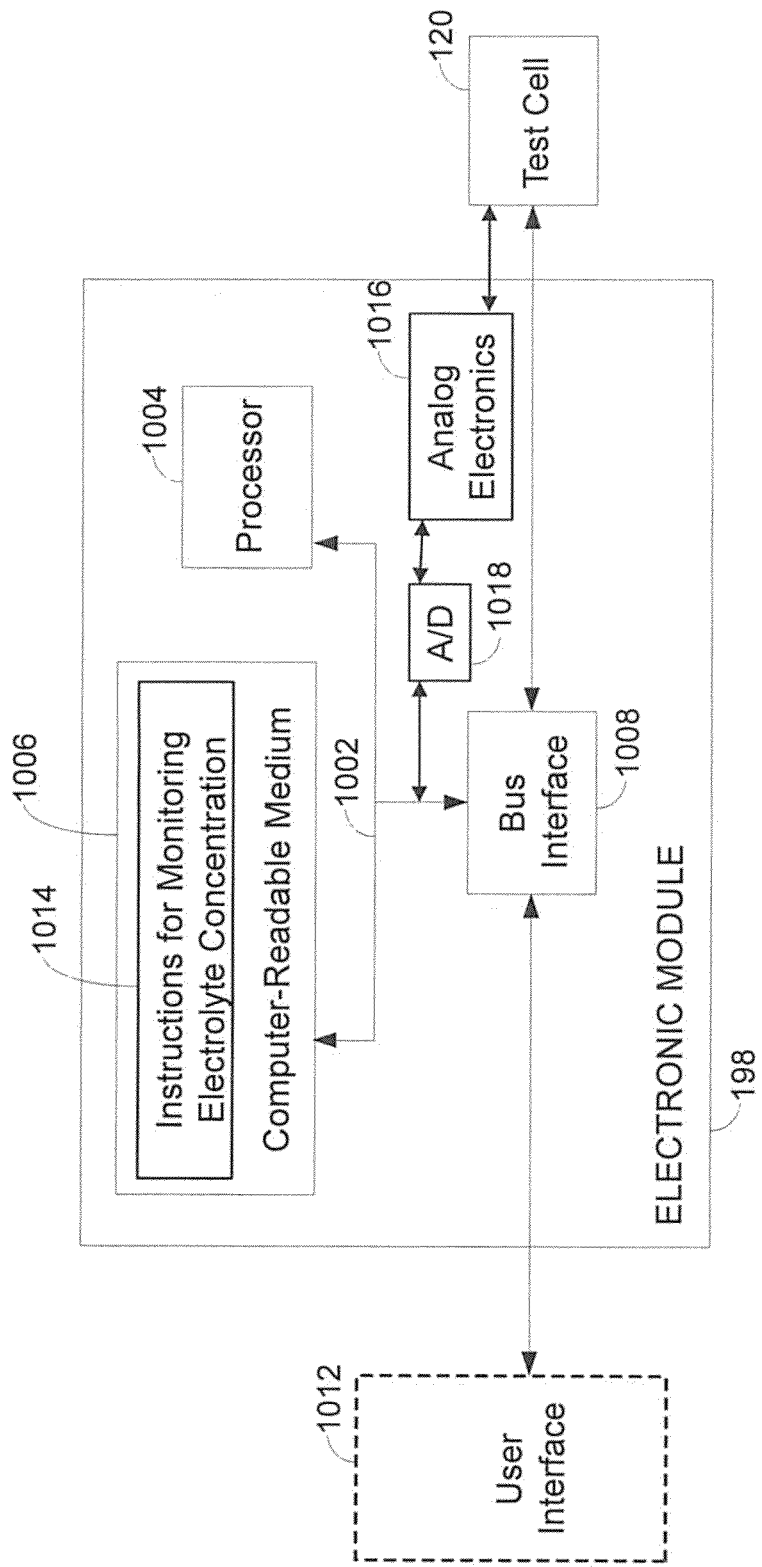
FIG. 18 is a schematic diagram of an electronic controller for monitoring and controlling a test cell according to one embodiment.

FIG. 18 is a schematic block diagram illustrating an example of a hardware implementation for an electronic module 198 for monitoring and controlling a test cell 120. In this example, the electronic module 198 may be implemented with a bus architecture, represented generally by the bus 1002. The bus 1002 may include any number of interconnecting buses and bridges depending on the specific application of the electronic module 198 and the overall design constraints. The bus 1002 links together various circuits including one or more processors, represented generally by the processor 1004, and computer-readable media, represented generally by the computer-readable medium 1006. The bus 1002 may also link various other circuits such as timing sources, peripherals, sensors, and power management circuits, which are well known in the art, and therefore, will not be described any further. A bus interface 1008 provides an interface between the bus 1002 and the test cell 120. Depending upon the nature of the apparatus, a user interface 1012 (e.g., keypad, display, speaker, microphone, joystick) may also be provided. The processor 1004 is responsible for managing the bus 1002 and general processing, including the execution of software or instructions 1014 stored on the computer-readable medium 1006. The software, when executed by the processor 1004, causes the electronic module 198 to perform the various functions described above for any particular apparatus. The computer-readable medium 1006 may also be used for storing data that is manipulated by the processor 1004 when executing software or instructions 1014. In some embodiments, analog electronics 1016 may also be joined to the bus 1002 by an analog-to-digital converter 1018 (and in some embodiments a digital-to-analog converter). Analog electronics 1016 may be provided to perform various analog functions such as voltage regulation, electric current measurement, current regulation or other functions.

Figure 19:
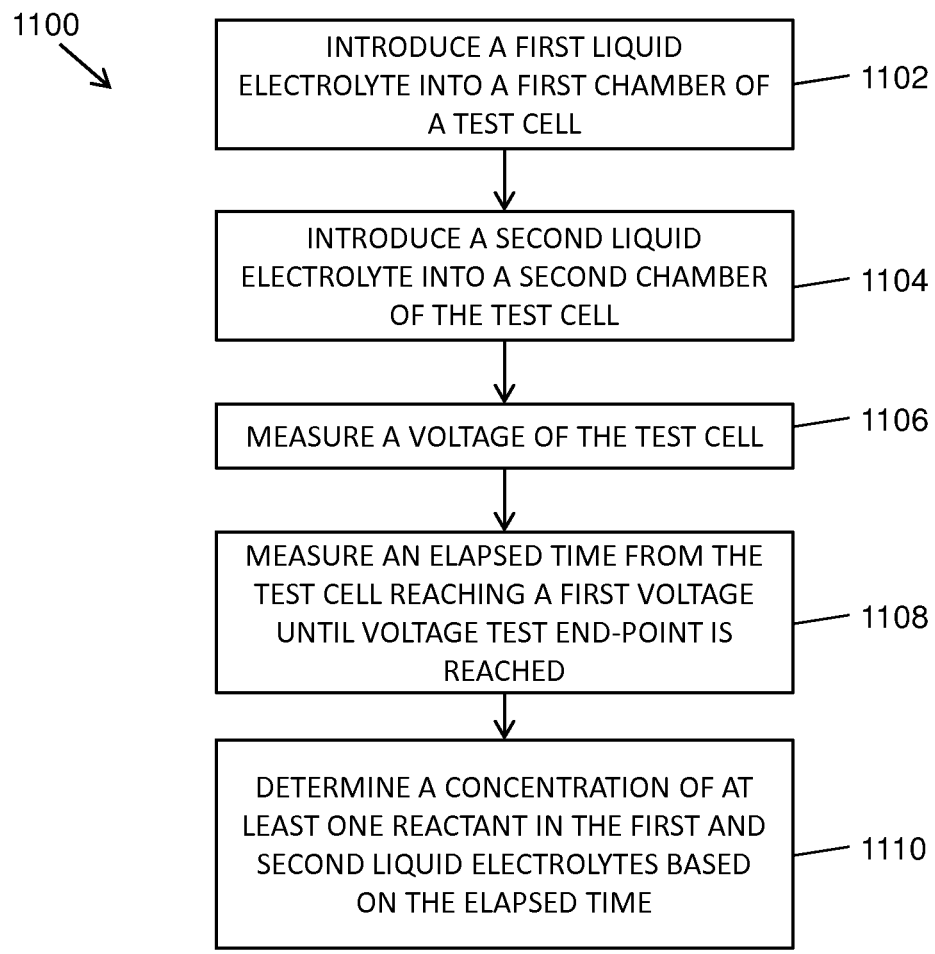
FIG. 19 is a flow diagram of a method of determining a degree of electrolyte imbalance in a reduction-oxidation (redox) flow battery system according to one embodiment method.

FIG. 19 illustrates a method 1100 of determining a degree of electrolyte imbalance in a reduction-oxidation (redox) flow battery system. In method 1100, a monitoring system may introduce a first liquid electrolyte into a first chamber of a test cell in block 1102 and introduce a second liquid electrolyte into a second chamber of the test cell in block 1104. The monitoring system may measure a voltage of the test cell in block 1106. The monitoring system may measure an elapsed time from the test cell reaching a first voltage until voltage test end-point is reached in block 1108. In block 1110, a monitoring system a may determine a concentration of at least one reactant in the first and second liquid electrolytes based on the elapsed time.

The foregoing description of the various embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, and instead the claims should be accorded the widest scope consistent with the principles and novel features disclosed herein.

In particular, materials and manufacturing techniques may be employed as within the level of those with skill in the relevant art. Furthermore, reference to a singular item, includes the possibility that there are plural of the same items present. More specifically, as used herein and in the appended claims, the singular forms "a," "and," "said," and "the" include plural referents unless the context clearly dictates otherwise. As used herein, unless explicitly stated otherwise, the term "or" is inclusive of all presented alternatives, and means essentially the same as the commonly used phrase "and/or." Thus, for example the phrase "A or B may be blue" may mean any of the following: A alone is blue, B alone is blue, both A and B are blue, and A, B and C are blue. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs.

What is claimed is:

1. A reduction-oxidation (redox) flow battery system, comprising:
   a redox flow battery;
   a first test cell fluidically coupled to the redox flow battery, the first test cell having a first chamber separated from a second chamber by a first separator membrane;
   a second test cell fluidically coupled to the redox flow battery, the second test cell having a first chamber separated from a second chamber by a second separator membrane;
   an electronic module; and
   a processor coupled to the electronic module;
   wherein the processor is configured with processor-executable instructions to perform operations comprising:
      causing the electronic module to operate a first electromechanical component to introduce a first sample of a first liquid electrolyte having a first unknown concentration of a first reactant into the first chamber of the first test cell;
      causing the electronic module to operate a second electromechanical component to introduce a second sample of the first liquid electrolyte having the first unknown concentration into the second chamber of the first test cell;
      causing the electronic module to charge the first test cell with a first known charging current from a first charging start time to a first predetermined stop point;
      causing the electronic module to measure a first open circuit voltage of the first test cell while charging the first test cell;
      causing the electronic module to measure a first total charging time from the first charging start time until the first predetermined stop point is reached;
      determining a first actual concentration of the first reactant in the first liquid electrolyte based on the first total charging time measured by the electronic module;
      causing the electronic module to operate a third electromechanical component to introduce a first sample of a second liquid electrolyte having a second unknown concentration of a second reactant into the first chamber of the second test cell;
      causing the electronic module to operate a fourth electromechanical component to introduce a second sample of the second liquid electrolyte solution having the second unknown concentration into the second chamber of the second test cell;
      causing the electronic module to charge the second test cell with a second known charging current from a second charging start time to a second predetermined stop point;
      causing the electronic module to measure a second open circuit voltage of the second test cell while charging the second test cell;

causing the electronic module to measure a second total charging time from the second charging start time until the second predetermined stop point is reached;

determining a second actual concentration of the second reactant in the second liquid electrolyte based on the second total charging time measured by the electronic module;

determining the degree of imbalance between the first reactant and the second reactant based on calculating a difference between the first actual concentration and the second actual concentration; and communicating the determined degree of imbalance to a main controller of the redox flow battery system to improve the operation of the redox flow battery system.

2. A method of operating a reduction-oxidation (redox) flow battery system, the method comprising:

mixing, using an electrolyte mixing device, a first liquid electrolyte having a first unknown concentration of a first reactant and a second liquid electrolyte having a second unknown concentration of a second reactant to form a mixed liquid electrolyte solution;

operating, using an electronic module, a first electromechanical component to introduce a first volume of the mixed liquid electrolyte solution into a first chamber of a test cell;

operating, using the electronic module a second electromechanical component to introduce a second volume of the mixed liquid electrolyte solution into a second chamber of the test cell;

charging, using the electronic module, the test cell to a predetermined stop point with a known charging current while measuring a voltage of the test cell;

measuring, using the electronic module, a total charging time from a start time of the charging the test cell to a predetermined stop point until the stop point is reached;

determining, using the electronic module, the degree of imbalance by determining an actual concentration of at least one of: the first reactant and the second reactant in the first and second liquid electrolytes based on the measured total charging time, wherein the degree of imbalance comprises a difference between the first concentration and the second concentration and communicating the determined degree of imbalance, from the electronic module to a main controller of the redox flow battery system, to improve the operation of the redox flow battery system.

3. A method of operating a reduction-oxidation (redox) flow battery system, the method comprising:

operating, using an electronic module, a first electromechanical component to introduce a first sample of a first liquid electrolyte having a first unknown concentration of a first reactant into a first chamber of a first test cell;

operating, using the electronic module, a second electromechanical component to introduce a second sample of the first liquid electrolyte having the first unknown concentration into a second chamber of the first test cell;

charging, using the electronic module, the first test cell with a first known charging current from a first charging start time to a first (predetermined stop point;

measuring, using the electronic module, a first open circuit voltage of the first test cell while charging the first test cell;

measuring, the electronic module, a first total charging time from the first charging start time until the first predetermined stop point is reached;

determining, using the electronic module, a first actual concentration of the first reactant in the first liquid electrolyte based on the first total charging time;

operating, using the electronic module, a third electromechanical component to introduce a first sample of a second liquid electrolyte having a second unknown concentration of a second reactant into a first chamber of a second test cell;

operating, using the electronic module, a fourth electromechanical component to introduce a second sample of the second liquid electrolyte solution having the second unknown concentration into a second chamber of the second test cell;

charging, using the electronic module, the second test cell with a second known charging current from a second charging start time to a second predetermined stop point;

measuring, using the electronic module, a second open circuit voltage of the second test cell while charging the second test cell;

measuring, using the electronic module, a second total charging time from the second charging start time until the second predetermined stop point is reached;

determining, using the electronic module, a second actual concentration of the second reactant in the second liquid electrolyte based on the second total charging time;

determining using the electronic module, the degree of imbalance between the first reactant and the second reactant based on a difference between the first actual concentration and the second actual concentration; and communicating the determined degree of imbalance, from the electronic module to a main controller of the redox flow battery system, to improve the operation of the redox flow battery system.

4. A method of operating a reduction-oxidation (redox) flow battery system, the method comprising:

operating, using an electronic module, a first electromechanical component to introduce a positive liquid electrolyte having a first unknown concentration of a positive reactant into a positive chamber of a test cell;

operating, using the electronic module, a second electromechanical component to introduce a negative liquid electrolyte having a second unknown concentration of a negative reactant into a negative chamber of the test cell;

discharging, using the electronic module, the test cell with a known discharging current;

separately measuring, using electronic module, a first voltage in the positive chamber of the test cell using a first reference electrode;

separately measuring, using the electronic module, a second voltage in the negative chamber of the test cell using a second reference electrode;

measuring, using the electronic module, an elapsed time from a start of said discharging the test cell until one of the positive chamber and the negative chamber is discharged to substantially zero volts as measured by the corresponding one of the first reference electrode and the second reference electrode;

determining, using the electronic module, a first actual concentration of a corresponding one of the positive reactant or the negative reactant in the discharged one of the positive chamber and the negative chamber based on the elapsed time;

charging, using the electronic module, the test cell to predetermined charging stop point while measuring a voltage of the test cell;

measuring, using the electronic module, a total charging time from a start of the charging the test cell to a predetermined charging stop point until the predetermined charging stop point is reached;

determining, using the electronic module, the degree of imbalance between electrolyte reactant concentrations based on the total charging time;

determining, using the electronic module, a second actual concentration of a corresponding other of the positive reactant and the negative reactant based on the first actual concentration and the degree of imbalance; and communicating, from the electronic module to a main controller of the redox flow battery system, the determined first actual concentration and the determined second actual concentration, to improve the operation of the redox flow battery system.

5. A method of operating a reduction-oxidation (redox) flow battery system, the method comprising:

operating, using an electronic module, a first electromechanical component to introduce a first liquid electrolyte into a first chamber of a test cell;

operating, using the electronic module, a second electromechanical component to introduce a second liquid electrolyte into a second chamber of the test cell;

measuring, using the electronic module, a voltage of the test cell;

measuring, using the electronic module, a total charging time from a start time at which the test cell reaches a first voltage until a stop time at which a voltage test end-point is reached at a second voltage;

determining, using the electronic module, a concentration of at least one reactant in the first and second liquid electrolytes based on the total charging time;

determining, using the electronic module, the degree of imbalance between reactant species in the first liquid electrolyte and the second liquid electrolyte that are generated during charging in the first and second liquid electrolytes based on the determined concentration; and communicating, from the electronic module to a main controller of the redox flow battery system, the determined degree of imbalance, to improve the operation of the redox flow battery system.

6. The method of claim 2, wherein measuring, using the electronic module, the voltage of the test cell while charging the test cell to a predetermined stop point comprises measuring, using the electronic module, an open-circuit voltage across both half-cells of the test cell.

7. The method of claim 6, further comprising measuring, using the electronic module, the open circuit voltage during a time interval when the known charging current is not applied.

8. The method of claim 2, wherein charging using the electronic module, the test cell with a known charging current comprises charging, using the electronic module, the test cell using pulsed charging in which the known charging current is applied during a first time interval followed by a second time interval during which the known charging current is switched off, wherein the application of the known charging current during the first time interval followed by the switching off of the known charging current during the second time interval is repeated until the predetermined stop point is reached.

9. The method of claim 8, wherein measuring, using the electronic module, the voltage of the test cell while charging the test cell to a predetermined stop point comprises measuring an open circuit voltage of the test cell during the second time intervals when the known charging current is switched off.

10. The method of claim 2, wherein the first reactant and the second reactant comprise one of an oxidized ionic species and a reduced ionic species produced during a charging process in the redox flow battery.

11. The method of claim 2, further comprising discharging, using the electronic module, the test cell after operating, using the electronic module, the first electromechanical component to introduce the first volume of the mixed liquid electrolyte solution into the first chamber of the test cell and after operating, using the electronic module, the second electromechanical component to introduce the second volume of the mixed liquid electrolyte solution into the second chamber of the test cell.

12. The method of claim 11, further comprising discharging, using the electronic module, the test cell by short circuiting a pair of electrodes of the test cell.

13. The method of claim 3, wherein charging, using the electronic module, at least one of: the first test cell with the first known charging current; and the second test cell with the second known charging current comprises charging, using the electronic module, the at least one using pulsed charging in which in which a corresponding at least one of the first known charging current and the second known charging current is applied during a first time interval followed by a second time interval during which the corresponding at least one of the first known charging current and the second known charging current is switched off, wherein the application of the corresponding at least one of the first known charging current and the second known charging current during the first time interval followed by the switching off of the corresponding at least one of the first known charging current and the second known charging current during the second time interval is repeated until the corresponding at least one of the first predetermined stop point and the second predetermined stop point is reached.

14. The method of claim 13, wherein measuring, using the electronic module, at least one of the first open circuit voltage of the first test cell and the second open circuit voltage of the second test cell comprises measuring, using the electronic module, the at least one of the first open circuit voltage of the first test cell and the second open circuit voltage of the second test cell during the second time intervals when the corresponding one of the first known charging current and the second known charging current is switched off.

15. The method of claim 3, wherein at least one of the first predetermined stop point and the second predetermined stop point comprises a point in time where a maximum rate of change of the corresponding at least one of the first measured open circuit voltage and the second measured open circuit voltage is reached.

16. The method of claim 3, wherein at least one of the first predetermined stop point and the second predetermined stop point comprises a predetermined open-circuit voltage for the corresponding at least one of the first open circuit voltage and the second open circuit voltage.

17. The method of claim 3, wherein at least one of the first predetermined stop point and the second predetermined stop point comprises a predetermined closed-circuit voltage.

18. The method of claim 3, wherein the first sample of the first liquid electrolyte and the second sample of the first liquid electrolyte respectively introduced into the first chamber and the second chamber of the first test cell, comprise equal volumes.

19. The method of claim 3, wherein the first reactant comprises an oxidized ionic species, and the second reactant comprises a reduced ionic species, the oxidized ionic species and the reduced ionic species produced when the first test cell and the second test cell are charged.

20. The method of claim 19, wherein the first reactant comprises $Fe^{3+}$ and the second reactant comprises $Cr^{2+}$.

21. The method of claim 20, wherein the first liquid electrolyte further comprises $Cr^{3+}$ ions, and the second liquid electrolyte further comprises $Fe^{2+}$ ions, and wherein charging the first test cell and charging the second test cell increases a quantity of the $Cr^{2+}$ and the $Fe^{3+}$.

22. The method of claim 3, further comprising measuring, using the electronic module, an electric potential of at least one of the first liquid electrolyte and the second liquid electrolyte with a reference electrode.

23. The method of claim 4, further comprising discharging, using the electronic module, the test cell by short-circuiting the positive half-cell and the negative half-cell, and measuring the discharge current.

24. The method of claim 4, further comprising discharging, using the electronic module, the test cell by applying a discharge current.

25. The method of claim 24, wherein discharging, using the electronic module, the test cell with a known discharging current comprises discharging, using the electronic module, the test cell using pulsed discharging in which the known discharging current is applied during a first time interval followed by a second time interval during which the known discharging current is switched off, wherein the application of the known discharging current during the first time interval followed by the switching off of the known discharging current during the second time interval is repeated.

26. The method of claim 4, wherein charging, using the electronic module, the test cell comprises charging, using the electronic module, the test cell using pulsed charging in which a charging current is applied during first time interval followed by a second time interval in which the charging current is switched off, wherein the application of the charging current during the first time interval followed by the switching off of the charging current during the second time interval is repeated.

27. The method of claim 26, wherein measuring, using the electronic module, the voltage of the test cell while charging the test cell comprises measuring, using the electronic module, an open circuit voltage of the test cell during the second time intervals when the charging current is switched off.

28. The method of claim 4, wherein the positive reactant and the negative reactant are ionic species generated when the test cell is charged.

29. The method of claim 4, wherein the first predetermined charging stop point comprises a point in time where a maximum rate of change of the voltage measured while charging reaches a maximum.

30. The method of claim 4, wherein the predetermined charging stop point is a predetermined open-circuit voltage measured while charging.

* * * * *